United States Patent
Tomimatsu et al.

(10) Patent No.: US 9,620,333 B2
(45) Date of Patent: Apr. 11, 2017

(54) CHARGED PARTICLE BEAM APPARATUS

(71) Applicant: HITACHI HIGH-TECH SCIENCE CORPORATION, Minato-ku, Tokyo (JP)

(72) Inventors: Satoshi Tomimatsu, Tokyo (JP); Makoto Sato, Tokyo (JP); Atsushi Uemoto, Tokyo (JP); Tatsuya Asahata, Tokyo (JP); Yo Yamamoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/833,563

(22) Filed: Aug. 24, 2015

(65) Prior Publication Data

US 2016/0064187 A1  Mar. 3, 2016

(30) Foreign Application Priority Data

Aug. 29, 2014 (JP) .................. 2014-176241
Feb. 19, 2015 (JP) .................. 2015-030458
Aug. 19, 2015 (JP) .................. 2015-161811

(51) Int. Cl.
*H01J 37/26* (2006.01)
*H01J 37/302* (2006.01)
*H01J 37/20* (2006.01)

(52) U.S. Cl.
CPC .......... *H01J 37/3023* (2013.01); *H01J 37/20* (2013.01); *H01J 2237/208* (2013.01); *H01J 2237/31745* (2013.01)

(58) Field of Classification Search
CPC .................................................... H01J 37/26

(Continued)

(56) References Cited

U.S. PATENT DOCUMENTS

2005/0045821 A1* 3/2005 Noji ................ G01N 23/225
                                              250/311
2007/0274593 A1  11/2007 Tsuneta et al. ........... 382/192

(Continued)

FOREIGN PATENT DOCUMENTS

EP   1204133   5/2002
EP   2693457   2/2014

(Continued)

OTHER PUBLICATIONS

European Search Report issued Jan. 27, 2016 in EPO Appln. No. EP 15 18 3056.

(Continued)

*Primary Examiner* — Nicole Ippolito
(74) *Attorney, Agent, or Firm* — Adams & Wilks

(57) ABSTRACT

A charged particle beam apparatus automatically prepares a sample piece from a sample and includes a charged particle beam irradiation optical system that irradiates a charged particle beam to a sample placed on a movable sample stage. A sample piece transferring unit holds and transfers a sample piece separated and extracted from the sample, and a holder support holds a sample piece holder to which the sample piece is transferred. A computer controls a position of an object based on a template prepared from an image of the object acquired by irradition with the charged particle beam and position information acquired from the image of the object. The sample piece transferring unit includes a needle that transfers the sample piece separated and extrated from the sample, and a needle actuting mechanism that actuates the needle. The computer controls the needle actuating mechanism so as to approach the needle to the sample piece using the template formed from an absorbed current image acquired by irradiating the needle with the charged particle beam.

7 Claims, 36 Drawing Sheets

(58) Field of Classification Search
USPC ............. 250/306, 307, 309, 310, 311, 492.1, 250/492.2, 492.3
See application file for complete search history.

(56) References Cited

U.S. PATENT DOCUMENTS

2008/0258056 A1* 10/2008 Zaykova-Feldman . G01N 23/04
250/307
2010/0213386 A1    8/2010 Man et al. .................... 250/400

FOREIGN PATENT DOCUMENTS

| JP | 5052721    | 3/1993  |
|----|------------|---------|
| JP | 2000171364 | 6/2000  |
| JP | 2008153239 | 7/2008  |
| JP | 2010190808 | 9/2010  |
| JP | 2013229188 | 11/2013 |
| WO | 2011148975 | 12/2011 |

OTHER PUBLICATIONS

Notification of Reasons for Refusal mailed Aug. 2, 2016 issued in Japanese Patent Application No. 2014-176239 together with English-language translation thereof.

* cited by examiner

CHARGED PARTICLE BEAM APPARATUS

BACKGROUND

Technical Field

The present invention relates to a charged particle beam apparatus that automatically performs sampling.

Related Art

In the related art, a device is known which extracts a sample piece which has been prepared by irradiating a sample with a charged particle beam including electrons or ions and works the sample piece into a shape suitable for various processes such as observation, analysis, and measurement using a scanning electron microscope, a transmission electron microscope, and the like (for example, see Japanese Unexamined Patent Application Publications No. 1 and No. 2 listed in below).

In the related art, a device is known which uses an image (also referred to as an absorbed current image or an inflow current image) formed from an ion beam current flowing in a needle to clearly locate a tip position of the needle in extracting a sample piece which has been prepared by irradiating a sample with a focused ion beam using the needle installed in the device and processing the sample piece into a shape suitable for various processes such as observation, analysis, and measurement using a scanning electron microscope, a transmission electron microscope, and the like (for example, see Japanese Unexamined Patent Application Publication No. 3 listed in below). In this device, when a surface of a sample has a complicated shape like a semiconductor device pattern, the tip position of the needle may not often be recognized due to an influence on the shape of the sample surface in a secondary electron image and thus an absorbed current image can be effectively used.

SUMMARY OF THE INVENTION

In this specification, "sampling" refers to extracting a sample piece which has been prepared by irradiating a sample with a charged particle beam and processing the sample piece into a shape suitable for various processes such as observation, analysis, and measurement, and more specifically refers to transferring a sample piece, which has been formed from a sample by processing using a focused ion beam, to a sample piece holder.

In the related art, it may not be said that a technique of automatically performing an operation of sampling a sample piece is satisfactorily implemented.

The difficulties in automatically performing the sampling are as follows. That is, a needle used to extract and carry a sample piece is not automatically recognized in the an image, a tip of a needle is deformed and thus shaping processing of the tip of the needle or replacement of the needle itself is necessary, and the like.

The difficulties in automatically recognizing a needle in an image are as follows. That is, when a tip position of a needle is checked using an electron beam, the tip member of the needle is not distinguished from a background image in a secondary electron image (or a reflected electron image), the tip of the needle is not recognized in the image, and thus an erroneous image is extracted or an image recognizing process is stopped.

In checking a tip position of a needle using an absorbed current image based on a charged particle beam (for example, electrons or negative ions), when a second electron yield of a tip material of the needle is close to 1 (one), the needle tip may not be distinguished from a background image and thus the needle tip may not be recognized. For example, a tungsten needle can be recognized in an absorbed current image, but when a carbon-deposition layer remains at the tip, it is difficult to recognize the carbon-deposition layer in the absorbed current image. The tip of the remaining carbon-deposition layer has to be determined as the tip of the needle, but since the carbon-deposition layer may not be recognized in image, the tip of the tungsten needle may be erroneously recognized as a true tip. When the needle approaches a delicate sample piece in this state and the needle is wanted to stop at the time of contact with the sample piece, the residue of the carbon-deposition layer remaining at the tip of the needle collides with the sample piece.

An absorbed current image which is used in a flow of the present invention is acquired using an electron beam or a charged particle beam such as a focused ion beam of negative ions, but an image acquired using an electron beam is representatively described in this specification.

In this way, the true tip of the needle including a carbon-deposition layer may not be moved to a target position using an image. At worst, a problem may be caused in which the needle collides with the sample piece to destroy the sample piece and a precious sample is lost. The needle may be deformed by the collision of the needle with the sample piece and the needle may have to be replaced. These problems hinder implementation of automatic sampling which is originally intended.

The present invention is made in consideration of the above-mentioned circumstances and one of objects thereof is to provide a charged particle beam apparatus that can automatically perform an operation of extracting a sample piece which has been formed by processing a sample using an ion beam and transferring the extracted sample piece to a sample piece holder.

In order to solve the above-mentioned problems and to achieve the above-mentioned object, the present invention employs the following aspects.

(1) According to an aspect of the present invention, there is provided a charged particle beam apparatus that automatically prepares a sample piece from a sample, including: a charged particle beam irradiation optical system that irradiates a charged particle beam; a sample stage that moves with the sample placed thereon; a sample piece transferring unit that holds and transfers the sample piece that is separated and extracted from the sample; a holder support that holds a sample piece holder to which the sample piece is transferred; and a computer that controls a position of an object based on a template prepared from an image of the object acquired by irradiation with the charged particle beam and position information acquired from the image of the object.

(2) In the charged particle beam apparatus according to (1), the sample piece transferring unit may include a needle that holds and transfers the sample piece that is separated and extracted from the sample and a needle actuating mechanism that actuates the needle, and the computer may control the needle actuating mechanism so as to control a position of the needle as the object relative to the sample piece.

(3) The charged particle beam apparatus according to (2) may further include a gas supply unit that supplies gas for forming a deposition layer by irradiation with the charged particle beam, and the computer may control the charged particle beam irradiation optical system, the needle actuating mechanism, and the gas supply unit so as to approach the needle to the sample piece with a gap formed therebetween and then to connect the needle to the sample piece with the deposition layer.

(4) In the charged particle beam apparatus according to (2), the computer may control the needle actuating mechanism so as to approach the needle to the sample piece using a template formed from an absorbed current image acquired by irradiating the needle with the charged particle beam and a tip coordinate of the needle acquired from a secondary electron image obtained by irradiating the needle with the charged particle beam.

(5) In the charged particle beam apparatus according to (3), the gap between the needle and the sample piece in which the deposition layer is formed may be equal to or less than 1 μm.

(6) In the charged particle beam apparatus according to (5), the gap between the needle and the sample piece in which the deposition layer is formed may be equal to or more than 100 nm and equal to or less than 400 nm.

(7) In the charged particle beam apparatus according to (1), the sample piece transferring unit may include a needle that holds and transfers the sample piece that is separated and extracted from the sample and a needle actuating mechanism that actuates the needle, the sample piece holder may include a pillar-shaped portion to which the sample piece is transferred, and the computer may control the needle actuating mechanism so as to control the position of the sample piece relative to the pillar-shaped portion as the object.

In the charged particle beam apparatus according to the present invention, since a tip of a needle can be accurately recognized by an image, it is possible to accurately control the position of the needle and to automatically continuously perform a sampling operation of extracting and transferring a sample piece, which has been formed by processing a sample using an ion beam, to a sample piece holder.

DESCRIPTION OF EMBODIMENTS OF THE INVENTION

Hereinafter, a charged particle beam apparatus according to an embodiment of the present invention which is capable of automatically preparing a sample piece will be described with reference to the accompanying drawings.

Figure 1:
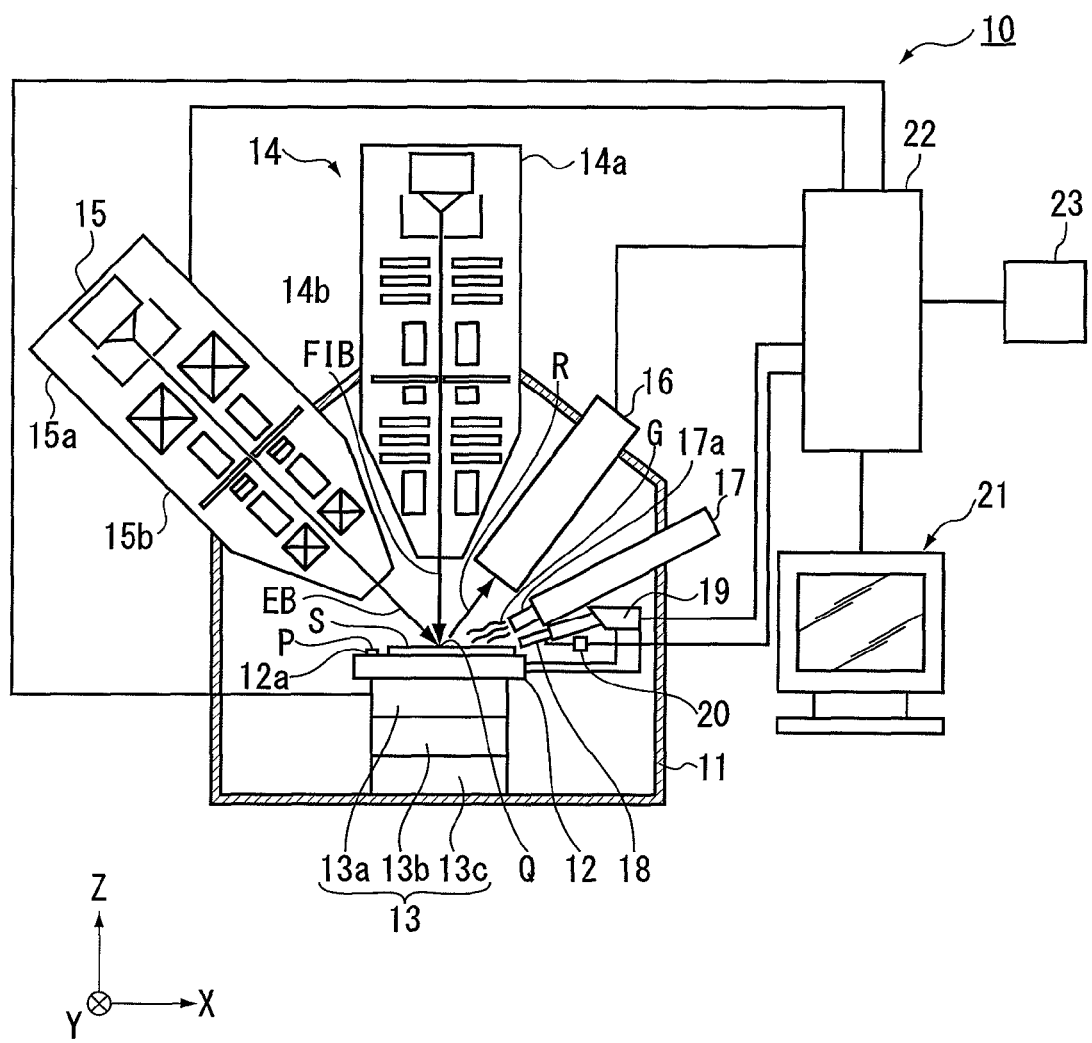
FIG. 1 is a diagram illustrating a configuration of a charged particle beam apparatus according to an embodiment of the present invention.

FIG. 1 is a diagram illustrating a configuration of a charged particle beam apparatus 10 according to an embodiment of the present invention. As illustrated in FIG. 1, the charged particle beam apparatus 10 according to the embodiment of the present invention includes a sample chamber 11 that is capable to keep the inside thereof in a vacuum state, a stage 12 that can fix a sample S and a sample piece holder P in the sample chamber 11, and a stage actuating mechanism 13 that actuates the stage 12. The charged particle beam apparatus 10 includes a focused ion beam irradiation optical system 14 that irradiates an irradiation target in a predetermined irradiation area (that is, scanning range) in the sample chamber 11 with a focused ion beam (FIB). The charged particle beam apparatus 10 includes an electron beam irradiation optical system 15 that irradiates an irradiation target in a predetermined irradiation area in the sample chamber 11 with an electron beam (EB). The charged particle beam apparatus 10 includes a detector 16 that detects secondary charged particles (such as secondary electrons and secondary ions) R generated from the irradiation target by irradiation with a focused ion beam or an electron beam. The charged particle beam apparatus 10 includes a gas supply unit 17 that supplies gas G to the surface of the irradiation target. The gas supply unit 17 includes, for example, a nozzle 17a with an outer diameter of about 200 μm or the like. The charged particle beam apparatus 10 includes a needle 18 that extracts a minute sample piece Q from a sample S fixed to the stage 12 and holds and transfers the sample piece Q to the sample piece holder P, a needle actuating mechanism 19 that actuates the needle 18 to carry the sample piece Q, and an absorbed current detector 20 that detects an inflow current (also referred to as an absorbed current) of the charged particle beam flowing in the needle 18 and sends an inflow current signal to a computer to convert the inflow current signal into an image.

The needle 18 and the needle actuating mechanism 19 may also be collectively referred to as a sample piece transferring unit. The charged particle beam apparatus 10 includes a display device 21 that displays image data and the like based on the secondary charged particles R detected by the detector 16, a computer 22, and an input device 23.

Examples of the irradiation target of the focused ion beam irradiation optical system 14 and the electron beam irradiation optical system 15 include the sample S fixed to the stage 12, the sample piece Q, and the needle 18 or the sample piece holder P which is present in the irradiation area.

The charged particle beam apparatus 10 according to this embodiment performs imaging of an irradiate part, a variety of processing (such as excavation and trimming) based on sputtering, forming of a deposition layer, and the like by irradiating the surface of an irradiation target with a focused ion beam while canning. The charged particle beam apparatus 10 can perform a processing of forming a sample piece Q (such as a thin sample or a needle-like sample) for transmission observation using a transmission electron microscope or an analysis sample piece using an electron beam from the sample S. The charged particle beam apparatus 10 can process the sample piece Q transferred to the sample piece holder P to a thin film with a desired thickness (for example, 5 nm to 100 nm) suitable for transmission observation using a transmission electron microscope.

The charged particle beam apparatus 10 can acquire a three-dimensional structure of the sample piece Q as well as a processing of forming the sample piece Q for transmission observation or analysis sample from the sample S. In the processing of acquiring a three-dimensional structure of the sample piece Q, a side surface of the extracted sample piece Q is thinly cut using a focused ion beam, and a secondary electron image which can be acquired by irradiating the cut surface with a focused ion beam or an electron beam is stored. By repeating the cutting and the storage of the secondary electron image, it is possible to acquire the three-dimensional structure of the sample piece Q.

The charged particle beam apparatus 10 may perform a processing of acquiring a three-dimensional element structure of the sample piece Q by repeating the cutting and the storage of an element distribution image of the cut surface.

The charged particle beam apparatus 10 can observe the surface of an irradiation target by irradiating the surface of the irradiation target such as the sample piece Q and the needle 18 with a focused ion beam or an electron beam while scanning.

The absorbed current detector 20 is provided with a preamplifier, amplifies an inflow current of the needle, and sends the amplified inflow current to the computer 22. The absorbed current image of the needle shape can be displayed on the display device 21 based on the needle inflow current detected by the absorbed current detector 20 and a signal synchronized with the scanning of a charged particle beam, and the needle shape or the tip position is specified.

Figure 2:
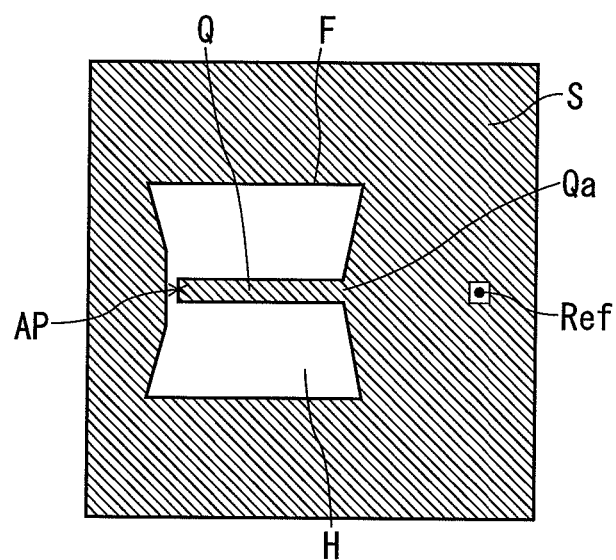
FIG. 2 is a plan view illustrating a sample piece which is formed in a sample in the charged particle beam apparatus according to the embodiment of the present invention.

FIG. 2 is a plan view illustrating a sample piece Q immediately before the sample piece is extracted from the sample S, where the sample piece is formed by irradiating the surface (the hatched portion) of the sample S with a focused ion beam in the charged particle beam apparatus 10 according to the embodiment of the present invention. Reference sign F denotes a processing frame to be processed by a focused ion beam, that is, a scanning range of the focused ion beam, and the inside (white part) thereof represents a processing area H which is sputtered and excavated by irradiation with the focused ion beam. Reference sign Ref denotes a reference mark (reference point) indicating a position at which the sample piece Q is formed (remains without being excavated), has a shape obtained by forming, for example, a fine hole with a diameter of 30 nm using a focused ion beam in a deposition layer (for example, a square with a side of 1 μm) to be described later, and can be recognized with good contrast in an image based on a focused ion beam or an electron beam. The deposition layer is used to locate the rough position of the sample piece Q and the fine hole is used for precise positioning. The sample piece Q in the sample S is etched such that the peripheral part on the lateral side and the bottom side is etched and removed with a support portion Qa connected to the sample S remaining, and the sample piece is supported to the sample S by the support portion Qa in a cantilever manner. The sample piece Q is a minute sample piece with a size in the length direction of, for example, about 10 μm, 15 μm, or 20 μm and with a width (thickness) of, for example, about 500 nm, 1 μm, 2 μm, or 3 μm.

The sample chamber 11 is configured to exhaust the inside thereof using an exhauster (not illustrated) up to a desired vacuum state and to maintain the desired vacuum state.

The stage 12 holds the sample S. The stage 12 includes a holder support 12a that holds the sample piece holder P. The holder support 12a may have a structure on which plural sample piece holders P can be mounted.

Figure 3:
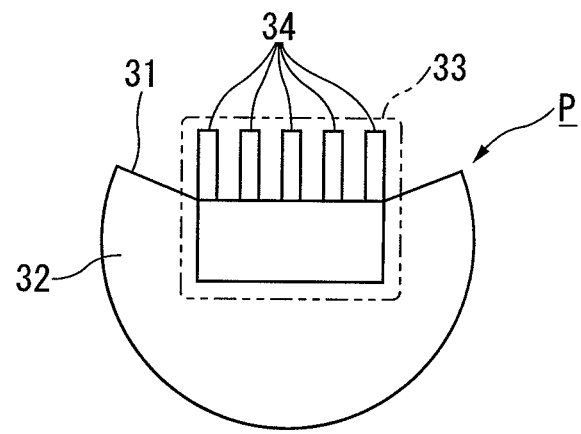
FIG. 3 is a plan view illustrating a sample piece holder of the charged particle beam apparatus according to the embodiment of the present invention.
Figure 4:
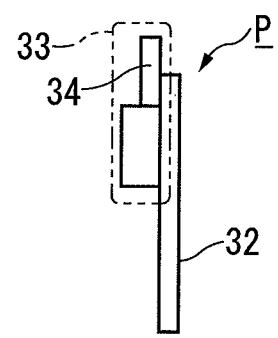
FIG. 4 is a side view illustrating the sample piece holder of the charged particle beam apparatus according to the embodiment of the present invention.

FIG. 3 is a plan view of the sample piece holder P and FIG. 4 is a side view thereof. The sample piece holder P includes a substantially-semicircular plate-like base 32 having a cutout portion 31 and a sample mount 33 which is fixed to the cutout portion 31. For example, the base 32 is formed in a circular plate shape with a diameter of 3 mm and a thickness of 50 μm out of metal. The sample mount 33 is formed, for example, from a silicon wafer through a semiconductor manufacturing process and is bonded to the cutout portion 31 with a conductive adhesive. The sample mount 33 has a comb-teeth shape and includes pillar-shaped portions (hereinafter, also referred to as pillars) 34 which are disposed to be separated from each other and to protrude and to which plural (for example, five, ten, fifteen, or twenty) sample pieces Q are transferred. By setting the widths of the pillar-shaped portions 34 to be different from each other, the sample pieces Q transferred to the pillar-shaped portions 34 and images of the pillar-shaped portions 34 can be correlated with each other and can be stored in the computer 22 in correlation with the corresponding sample piece holder P. Accordingly, even when plural sample pieces Q are prepared from a single sample S, the sample pieces can be recognized without any mistake and the sample pieces Q and the extracted positions on the sample S can be correctly correlated with each other in analysis using a subsequent transmission electron microscope. Each pillar-shaped portion 34 is formed, for example, to have a thickness of a tip of equal to or less than 10 μm or equal to or less than 5 μm, and holds a sample piece Q attached to the tip portion thereof.

The base 32 is not limited to the above-mentioned circular plate shape with a diameter of 3 mm and a thickness of 50 μm, but may have, for example, a rectangular plate shape with a length of 5 mm, a height of 2 mm, and a thickness of 50 μm. The base 32 only has to have a shape which can be mounted on the stage 12 introduced into a subsequent transmission electron microscope and a shape in which all the sample pieces Q mounted on the sample mount 33 are located within a movable range of the stage 12. According to the base 32 having this shape, all the sample pieces Q mounted on the sample mount 33 can be observed with a transmission electron microscope.

The stage actuating mechanism 13 is accommodated in the sample chamber 11 in a state in which the stage actuating mechanism 13 is connected to the stage 12, and displaces the stage 12 about a predetermined axis in accordance with a control signal output from the computer 22. The stage actuating mechanism 13 includes at least a actuating mechanism 13a that moves the stage 12 in parallel to an X axis and a Y axis which are parallel to a horizontal plane and perpendicular to each other and a Z axis which is parallel to the vertical direction perpendicular to the X axis and the Y axis. The stage actuating mechanism 13 includes a tiling mechanism 13b that tilts the stage 12 about the X axis or the Y axis and a rotating mechanism 13c that rotates the stage 12 about the Z axis.

The focused ion beam irradiation optical system 14 is fixed to the sample chamber 11 in a state in which a beam emitting unit (not illustrated) in the sample chamber 11 faces the stage 12 at a position above the stage 12 in the irradiation area in the vertical direction and an optical axis thereof is parallel to the vertical direction. Accordingly, an irradiation target such as a sample S and a sample piece Q which are placed on the stage 12 and a needle 18 which is present in the irradiation area can be irradiated with a focused ion beam downward from an upper side in the vertical direction. The charged particle beam apparatus 10 may include another ion beam irradiation optical system instead of the focused ion beam irradiation optical system 14. The ion beam irradiation optical system is not limited to the above-mentioned optical system for forming a focused beam. The ion beam irradiation optical system may be, for example, a projection type ion beam irradiation optical system in which a stencil mask having a fixed-shape aperture is disposed in an optical system and a shaped beam having the aperture shape of the stencil mask is formed. According to this projection type ion beam irradiation optical system, it is possible to accurately form a shaped beam having a shape corresponding to the processing area around the sample piece Q and thus to shorten a processing time.

The focused ion beam irradiation optical system 14 includes an ion source 14a that generates ions and an ion optical system 14b that focuses and deflects the ions emitted from the ion source 14a. The ion source 14a and the ion optical system 14b are controlled in accordance with a control signal output from the computer 22 and an irradiation position, irradiation conditions, and the like of the focused ion beam are controlled by the computer 22. Examples of the ion source 14a include a liquid metal ion source, a plasma ion source, and a gas field ionization ion source which use liquid gallium or the like. The ion optical system 14b includes, for example, a first electrostatic lens such as a condenser lens, an electrostatic deflector, and a second electrostatic lens such as an objective lens. When a plasma ion source is used as the ion source 14a, high-speed processing using a large-current beam can be implemented, which is suitable for extraction of a large sample S.

The electron beam irradiation optical system 15 is fixed in the sample chamber 11 in a state in which a beam emitting unit (not illustrated) in the sample chamber 11 faces the stage 12 from an tilt direction which is tilted by a predetermined angle (for example, 60°) about the vertical direction of the stage 12 in the irradiation area and an optical axis thereof is parallel to the tilt direction. Accordingly, an irradiation target such as a sample S and a sample piece Q which are fixed to the stage 12 and a needle 18 which is present in the irradiation area can be irradiated with an electron beam downward from an upper side in the tilt direction.

The electron beam irradiation optical system 15 includes an electron source 15a that generates electrons and an electron optical system 15b that focuses and deflects the electrons emitted from the electron source 15a. The electron source 15a and the electron optical system 15b are controlled in accordance with a control signal output from the computer 22 and an irradiation position, irradiation conditions, and the like of the electron beam are controlled by the computer 22.

The focused ion beam irradiation optical system 14 and the electron beam irradiation optical system 15 may be exchanged with each other in position, the electron beam irradiation optical system 15 may be arranged in the vertical direction, and the focused ion beam irradiation optical system 14 may be arranged in the tilt direction which is tilted by a predetermined angle about the vertical direction.

The detector 16 detects intensity of secondary charged particles (secondary electrons and secondary ions) (that is, an amount of secondary charged particles) R emitted from the irradiation target when the irradiation target such as a sample S and a needle 18 is irradiated with a focused ion beam or an electron beam, and outputs information of the amount of secondary charged particles R detected. The detector 16 is disposed at a position at which the amount of secondary charged particles R can be detected in the sample chamber 11, for example, a position obliquely above the irradiation target such as the sample S in the irradiation area, and is fixed to the sample chamber 11.

The gas supply unit 17 is fixed to the sample chamber 11, includes a gas injecting outlet (also referred to as a nozzle) in the sample chamber 11, and is disposed to face the stage 12. The gas supply unit 17 can supply the sample S with etching gas for selectively promoting etching of the sample S with a focused ion beam depending on the material of the sample S and deposition gas for forming a deposition layer on the surface of the sample S out of deposits of metal, insulator, or the like. For example, by supplying a sample S with etching gas such as xenon fluoride for a silicon-based sample S and water for an organic sample S along with irradiation with a focused ion beam, the etching can be promoted selectively depending on the materials. For example, by supplying a sample S with deposition gas containing platinum, carbon, or tungsten along with irradiation with a focused ion beam, solid components decomposed from the deposition gas can be deposited on the surface of the sample S. Specific examples of the deposition gas include phenanthrene, naphthalene, or pyrene as the gas containing carbon, trimethyl ethylcyclopentadienyl platinum as the gas containing platinum, and tungsten hexacarbonyl as the gas containing tungsten. Depending on the supply gas, etching or deposition may be carried out by irradiation with an electron beam. As the deposition gas in the charged particle beam apparatus 10 according to the present invention, the deposition gas containing carbon, such as phenanthrene, naphthalene, or pyrene, is optimal in view of a deposition speed and satisfactory attachment of the deposition layer between the sample piece Q and the needle 18, and any thereof can be used.

The needle actuating mechanism 19 is accommodated in the sample chamber 11 in a state in which the needle 18 is connected thereto, and actuates the needle 18 in accordance with a control signal output from the computer 22. The needle actuating mechanism 19 is integrally formed with the stage 12 and moves along with the stage 12, for example, when the stage 12 rotates about the tilt axis (that is, the X axis or the Y axis) by the tilting mechanism 13b. The needle actuating mechanism 19 includes a actuating mechanism (not illustrated) that moves the needle 18 in parallel to each of three-dimensional coordinate axes and a rotating mechanism (not illustrated) that rotates the needle 18 around the central axis of the needle 18. These three-dimensional coordinate axes are independent of the orthogonal three-axis coordinate system of the sample stage, and this coordinate system is tilted and rotated when the surface of the stage 12 is in a tilted state and in a rotating state in the orthogonal three-axis coordinate system based on two-dimensional coordinate axes parallel to the surface of the stage 12.

The computer 22 controls at least the stage actuating mechanism 13, the focused ion beam irradiation optical system 14, the electron beam irradiation optical system 15, the gas supply unit 17, and the needle actuating mechanism 19.

The computer 22 is disposed outside the sample chamber 11 and is connected to a display device 21 and an input device 23 such as a mouse or a keyboard that outputs a signal corresponding to an input operation from an operator.

The computer 22 collectively controls the operations of the charged particle beam apparatus 10 based on a signal output from the input device 23, a signal generated through a predetermined automatic operation control process, or the like.

The computer 22 converts an amount of secondary charged particles R detected by the detector 16 into a luminance signal correlated with the irradiation position while scanning the irradiation position with the charged particle beam and generates image data indicating the shape of the irradiation target by a two-dimensional position distribution of the amount of secondary charged particles R detected. In an absorbed current image mode, the computer 22 generates absorbed current image data indicating the shape of the needle 18 by a two-dimensional position distribution of an absorbed current (absorbed current image) by detecting the absorbed current flowing in the needle 18 while scanning the irradiation position with the charged particle beam. The computer 22 displays a screen for performing operations such as enlargement, reduction, movement, and rotation of image data along with the generated image data on the display device 21. The computer 22 displays a screen for performing various settings such as mode selection and processing setting in automatic sequence control on the display device 21.

The charged particle beam apparatus 10 according to the embodiment of the present invention has the above-mentioned configuration. The operation of the charged particle beam apparatus 10 will be described below.

An automatic sampling operation which is performed by the computer 22, that is, an operation of automatically transferring a sample piece Q, which has been formed by processing a sample S with a charged particle beam (focused ion beam), to the sample piece holder P will be sequentially described below roughly in an initial setting step, a sample piece pickup step, and a sample piece mounting step.

Initial Setting Step

Figure 5:
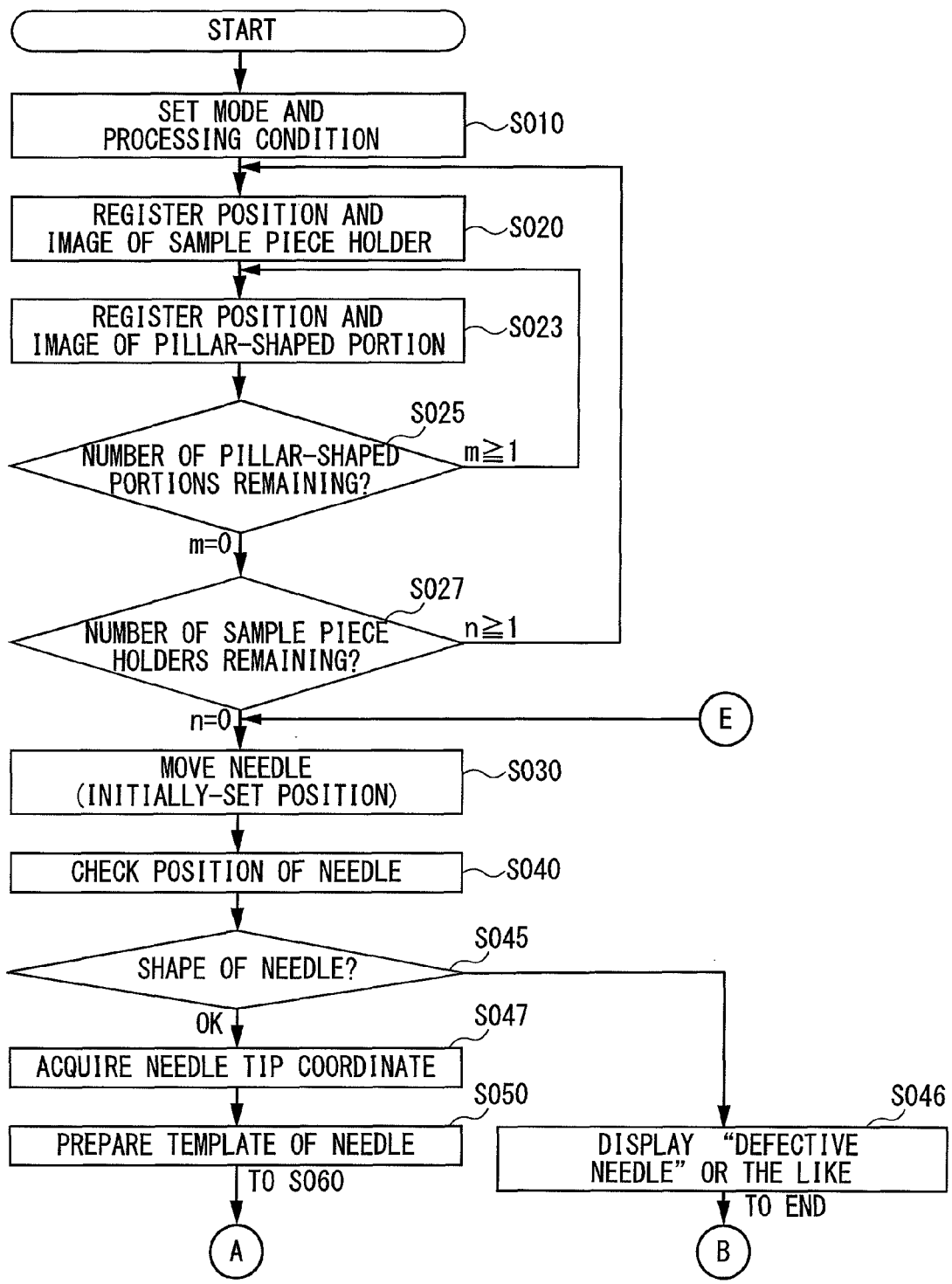
FIG. 5 is a flowchart illustrating particularly an initial setting step in a flowchart illustrating a process flow of the charged particle beam apparatus according to the embodiment of the present invention.

FIG. 5 is a flowchart illustrating a flow of an initial setting step in the automatic sampling operation which is performed by the charged particle beam apparatus 10 according to the embodiment of the present invention. First, the computer 22 performs mode selection such as presence of a posture control mode to be described later, setting of observation conditions for template matching and processing conditions (setting of processing position, size, number, and the like), check of a needle tip shape, and the like based on an input from an operator at the time of start of the automatic sequence (step 010).

Then, the computer 22 prepares a template of the pillar-shaped portion 34 (steps S020 to S027). In preparing the template, first, the computer 22 performs a position registration process on the sample piece holder P mounted on the holder support 12a of the stage 12 by the operator (step S020). The computer 22 prepares the template of the pillar-shaped portion 34 at the time of start of the sampling process. The computer 22 prepares the template for each pillar-shaped portion 34. The computer 22 acquires a stage coordinate of each pillar-shaped portion 34, prepares the template thereof, stores the stage coordinates and the templates in sets, and uses the stored information to determine the shape of the pillar-shaped portion 34 by later template matching (superposition of a template and an image). The computer 22 stores, for example, an image itself and edge information extracted from the image in advance as the template of the pillar-shaped portion 34 used for the template matching. The computer 22 recognizes the accurate position of the pillar-shaped portion 34 by performing the template matching after movement of the stage 12 and determining the shape of the pillar-shaped portion 34 based on the score of the template matching in a later process. Preferably, the accurate template matching can be carried out by using the same observation conditions such as contrast and magnification as preparing the template as observation conditions for the template matching.

When plural sample piece holders P are mounted on the holder support 12a and plural pillar-shaped portions 34 are formed in each sample piece holder P, a recognition code specific to each sample piece holder P and a recognition code specific to each pillar-shaped portion 34 of the sample piece holder P may be determined in advance and the recognition codes may be stored in the computer 22 in correlation with the coordinates and the template information of the pillar-shaped portions 34.

The computer 22 may store the coordinates of parts (extracted parts) from which a sample piece Q is extracted in the sample S and image information of the peripheral sample surface as sets along with the recognition codes, the coordinates of the pillar-shaped portions 34, and the template information.

For example, regarding indeterminate samples such as rocks, minerals, and biological samples, the computer 22 may set a low-magnification wide-field image, a positional coordinate of an extracted part, and an image as a set and may store this information as recognition information. The recognition information may be correlated with a thin sample S or may be correlated with a transmission electron microscope image and an extraction position of the sample S.

The computer 22 may confirm that a sample mount 33 having an appropriate shape is actually present in advance by performing the position registration process of the sample piece holder P prior to movement of the sample piece Q to be described later.

In the position registration process, first, as a coarse adjustment operation, the computer 22 moves the stage 12 using the stage actuating mechanism 13 and positions the irradiation area with the position at which the sample mount 33 is attached to the sample piece holder P. Then, as a fine adjustment operation, the computer 22 extracts positions of plural pillar-shaped portions 34 constituting the sample mount 33 from image data generated by irradiation with charged particle beams (a focused ion beam and an electron beam) using a template prepared from a designed shape (CAD information) of the sample mount 33 in advance. Then, the computer 22 registers (stores) the positional coordinates and the images of the extracted pillar-shaped portions 34 as attachment positions of the sample pieces Q (step S023). At this time, the computer 22 checks deformation, chipping, missing, or the like of each pillar-shaped portion 34 by comparing the image of the pillar-shaped portion 34 with a design drawing or a CAD drawing of the pillar-shaped portion or a standard image of the pillar-shaped portion 34, and stores information indicating a defective product along with the positional coordinate and the image of the pillar-shaped portion 34 when the pillar-shaped portion 34 is defective.

Then, the computer 22 determines whether a pillar-shaped portion 34 to be registered remains in the sample piece holder P under the current registration process (step S025). When the determination result is "NO," that is, when the number of pillar-shaped portions 34 remaining to be registered m is equal to or greater than 1 (one), the process flow is returned to step S023 and steps S023 and S025 are repeated until the number of pillar-shaped portions 34 remaining m is zero. On the other hand, when the determination result is "YES," that is, when the number of pillar-shaped portions 34 remaining to be registered m is zero, the process flow moves to step S027.

When plural sample piece holders P are mounted on the holder support 12a, the positional coordinates of the sample piece holders P and image data of the sample piece holders P are recorded along with code numbers of the sample piece holders P and the like, and the positional coordinates, the code numbers, and the image data of the pillar-shaped portions 34 of each sample piece holder P are additionally stored (registered). The computer 22 may sequentially perform the position registration process by the number of sample pieces Q to be subjected to the automatic sampling.

The computer 22 determines whether a sample piece holder P to be registered remains (step S027). When the determination result is "NO," that is, when the number of sample piece holders P remaining to be registered n is equal to or greater than 1, the process flow is returned to step S020, and steps S020 to S027 are repeated until the number of sample piece holders P remaining n is zero. On the other hand, when the determination result is "YES," that is, when the number of sample piece holders P remaining to be registered n is zero, the process flow moves to step S030.

Accordingly, when several tens of sample pieces Q are automatically prepared from a single sample S, positions of plural sample piece holders P are registered in the holder support 12a and the positions of the pillar-shaped portions 34 are registered in an image. Accordingly, a specific sample piece holder P to which several tens of sample pieces Q are mounted and a specific pillar-shaped portion 34 therein can be called into a viewing field of a charged particle beam at once.

In the position registration process (steps S020 and S023), when the sample piece holder P itself or the pillar-shaped portion 34 is deformed or destroyed and the sample piece Q may not be mounted thereon, "disabled" (a notice indicating that a sample piece Q is not mounted) or the like is registered along with the positional coordinate, the image data, and the code number. Accordingly, at the time of transferring a sample piece Q to be described later, the computer 22 can skip the sample piece holder P or the pillar-shaped portion 34 registered as "disabled" and can move a next normal sample piece holder P or pillar-shaped portion 34 into the observation field.

Then, the computer 22 prepares a template of the needle 18 (steps S030 to S050). The template is used for image matching to be described later when the needle is accurately approached to the sample piece.

In the template preparing step, first, the computer 22 moves the stage 12 using the stage actuating mechanism 13 once. Subsequently, the computer 22 moves the needle 18 to an initially-set position using the needle actuating mechanism 19 (step S030). The initially-set position is a point (coincidence point) at which the almost same point can be irradiated with a focused ion beam and an electron beam and both beams are focused and is a predetermined position at which a complicated structure such as the sample S to be misunderstood as the needle 18 is not present in the background of the needle 18 due to previous movement of the stage. The coincidence point is a position at which the same object can be observed at different angles by irradiation with a focused ion beam and an electron beam.

Then, the computer 22 recognizes the position of the needle 18 in a secondary electron image mode based on irradiation with an electron beam (step S040).

The computer 22 detects secondary electrons generated from the needle 18 by irradiating the needle 18 with an electron beam while scanning, and generates secondary electron (SEM) image data. At this time, since the secondary electron image does not include a background to be misunderstood as the needle 18, it is possible to surely recognize only the needle 18. The computer 22 acquires the secondary electron image data by irradiation with an electron beam.

The computer 22 determines the shape of the needle 18 at step S045.

Figure 20:
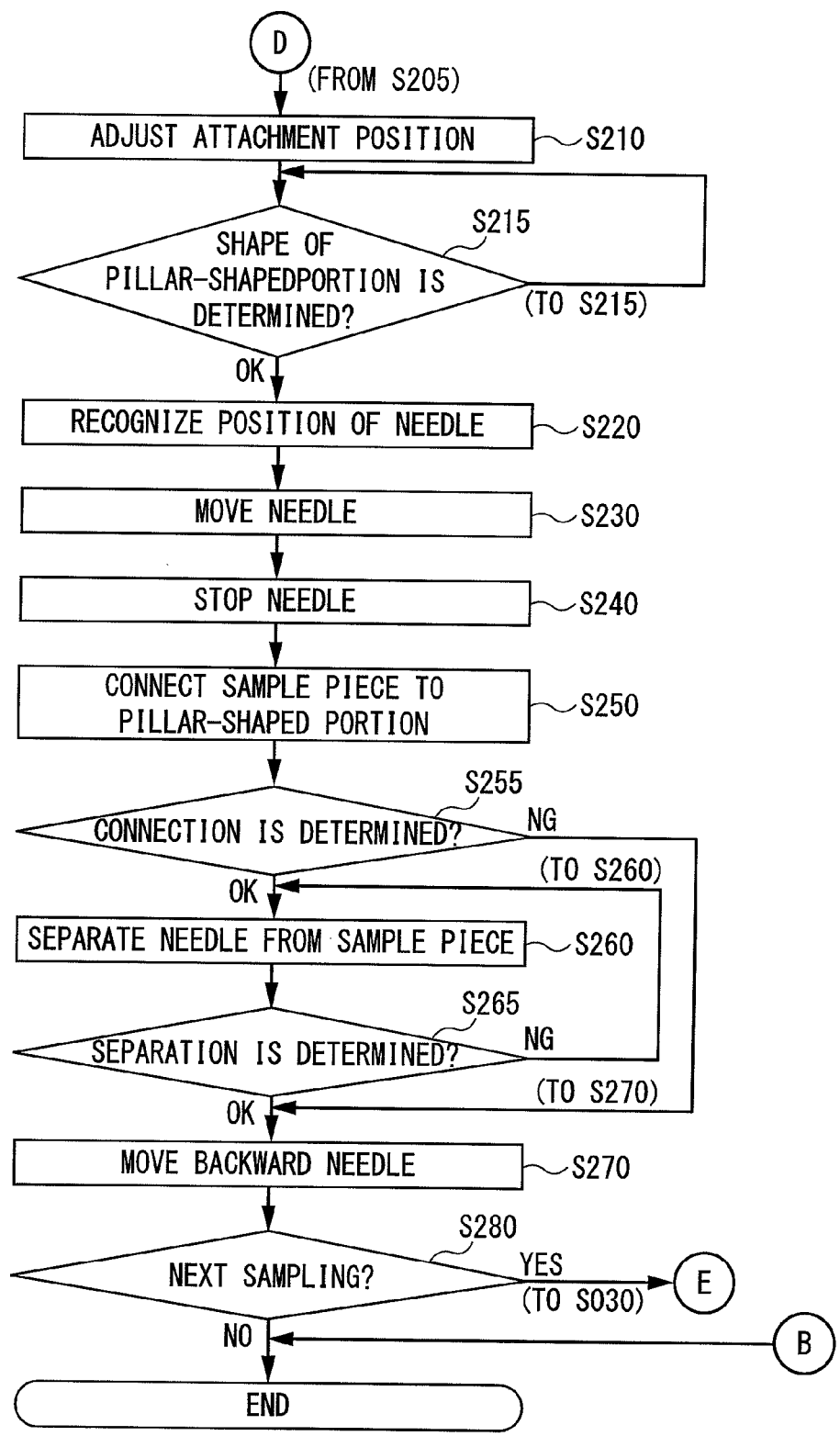
FIG. 20 is a flowchart illustrating particularly the sample piece mounting step in the flowchart illustrating the process flow of the charged particle beam apparatus according to the embodiment of the present invention.

When a sample piece Q may not be attached due to deformation or destruction of the tip shape of the needle 18, the process flow moves directly to step S280 in FIG. 20, all the steps after step S050 are not performed, and the automatic sampling operation is completed. That is, when the needle tip shape is defective, the operation is not performed any more and an operation of replacing the needle is carried out by a device operator. In the determination of the needle shape in step S045, it is determined that the needle is defective when the needle tip position departs, for example, by 100 μm or more from a predetermined position in an observation field with a side of 200 μM. When it is determined in step S045 that the needle is defective, "defective needle" or the like is displayed on the display device 21 (step S046) to given a warning to the device operator. The needle 18 determined to be defective may be replaced with a new needle 18, or the tip of the needle 18 which is less defective may be shaped by irradiation with a focused ion beam.

When it is determined in step S045 that the needle 18 has a predetermined normal shape, the process flow moves to step S047.

In step S047, a process of extracting a shape of an edge (tip) of the needle 18 from the acquired secondary electron image is performed and the coordinate of the tip of the needle 18 (needle tip) in the SEM image is acquired. The deposition layer attached to the needle tip can be clearly located in the secondary electron image and the tip of the deposition layer is a desired coordinate.

The state of the needle tip will be described below.

Figure 6:
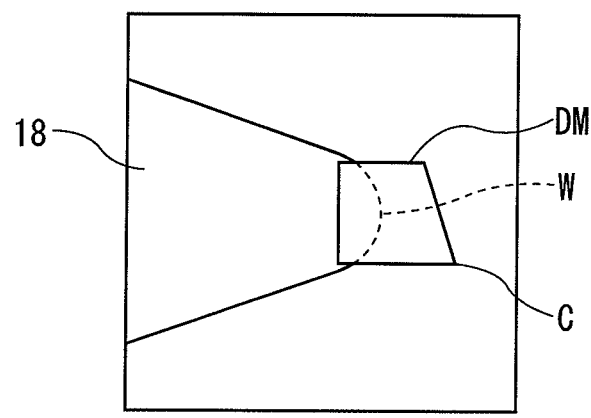
FIG. 6 is a diagram schematically illustrating a true tip of a needle which has been repeatedly used in the charged particle beam apparatus according to the embodiment of the present invention.

FIG. 6 is an enlarged view schematically illustrating a tip of a tungsten needle 18 which is used to describe a state of a probe tip used in repeated sampling. When the needle 18 is repeatedly used for the sampling operation in a state in which the tip thereof is not cut nor deformed, a part of a carbon-deposition layer DM holding the sample pieces Q is attached as a residue to the needle tip. That is, the residue has a shape which slightly protrudes from the tip position of the tungsten needle 18. Accordingly, the true tip coordinate of the needle 18 is not the tip W of the tungsten needle as the original needle 18 but is the residue tip C of the carbon-deposition layer.

Figure 7:
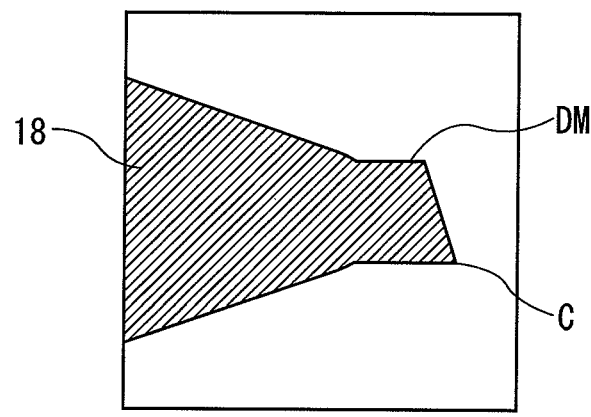
FIG. 7 is a diagram schematically illustrating a secondary electron image formed by irradiating a needle tip with an electron beam in the charged particle beam apparatus according to the embodiment of the present invention.

FIG. 7 is a diagram schematically illustrating a secondary electron image of the tungsten needle 18 to which a residue of a carbon-deposition layer DM is attached based on irradiation with an electron beam. Since the carbon-deposition layer DM can be clearly confirmed in the secondary electron image, the coordinate of the tip C of the carbon-deposition layer DM is determined as the true tip coordinate of the needle from the secondary electron image.

Figure 8:
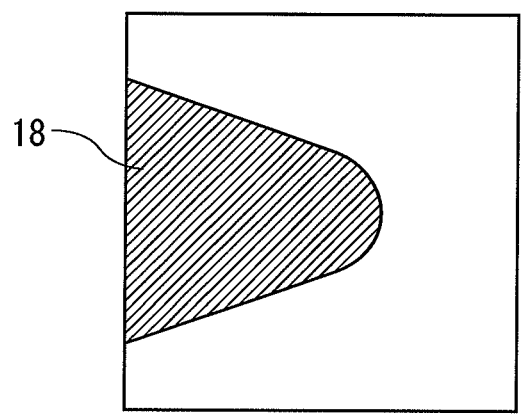
FIG. 8 is a diagram schematically illustrating an absorbed current image formed by irradiating the needle tip with an electron beam in the charged particle beam apparatus according to the embodiment of the present invention.

FIG. 8 is a diagram schematically illustrating an absorbed current image of the tungsten needle 18 to which a residue of a carbon-deposition layer DM is attached based on irradiation with an electron beam. Since the tip of the needle 18 is enlarged, the tip is emphasized as being rounded. The absorbed current image of the needle 18 is not affected by the background and thus only the needle 18 can be imaged. However, depending on the irradiation conditions with an electron beam, electric charges flowing in by irradiation and electric charges emitted by secondary electrons are cancelled and thus the carbon-deposition layer DM may not be clearly confirmed in the absorbed current image. That is, since the true needle position including the carbon-deposition layer DM may not be recognized in the absorbed current image, there is a high risk that the needle tip collides with the sample piece Q when the needle 18 is moved based on only the absorbed current image.

Subsequently to step S047, the template of the needle tip is prepared (step S050).

The mode is switched to an absorbed current mode of an electron beam in the same observation field as in step S047, an absorbed current image of the needle tip is acquired as a reference image, and then image data obtained by extracting a part of an area including the needle tip based on the needle tip coordinate acquired in step S047 in reference image data is set as a template. The template and the reference coordinate of the needle tip acquired in step S047 are registered in the computer 22 in correlation with each other.

When a template is prepared using the absorbed current image, various shapes which will be misunderstood as the needle 18 such as the processing shape of the sample piece Q or the pattern of the sample surface are present in the background of the needle 18 as the needle 18 approaches the sample piece Q. Accordingly, the absorbed current image which is not affected by the background is used to prevent misunderstanding. Since the secondary electron image is easily affected by the background as described above and has a high risk of misunderstanding, the secondary electron image is not suitable as a template image. In this way, since the deposition layer of the needle tip may not be recognized in the absorbed current image, the true needle tip may not be located, but the absorbed current image is suitable in view of pattern matching with the template.

The same observation field is used in step S050, but the present invention is not limited to the same observation field as long as the standard of beam scanning is managed. The template includes the needle tip in step S050, but an area not including the tip may be used as the template as long as the coordinate thereof is correlated with the reference coordinate. The secondary electron image is exemplified in FIG. 7, but a reflected electron image can also be used to identify the coordinate of the tip C of the carbon-deposition layer DM.

Since image data actually acquired before the needle 18 is moved is used as the reference image data, the computer 22 can perform high-accuracy pattern matching without depending on the differences in shape between the needles 18. The computer 22 acquires image data in a state in which there is no complicated structure in the background and thus can accurately acquire the true coordinate of the needle tip. Accordingly, it is possible to acquire a template from which the shape of the needle 18 from which the influence of the background is excluded can be clearly located.

The computer 22 uses image acquisition conditions such as suitable magnification, luminance, and contrast stored in advance to enhance recognition accuracy of an object at the time of acquiring image data.

The step (S020 to S027) of preparing the templates of the pillar-shaped portions 34 and the step (S030 to S050) of preparing the template of the needle 18 may be inverted. When the step (S030 to S050) of preparing the template of the needle 18 is performed earlier, the flow (E) returned from step S280 to be described later interlinks therewith.

Sample Piece Pickup Step

Figure 9:
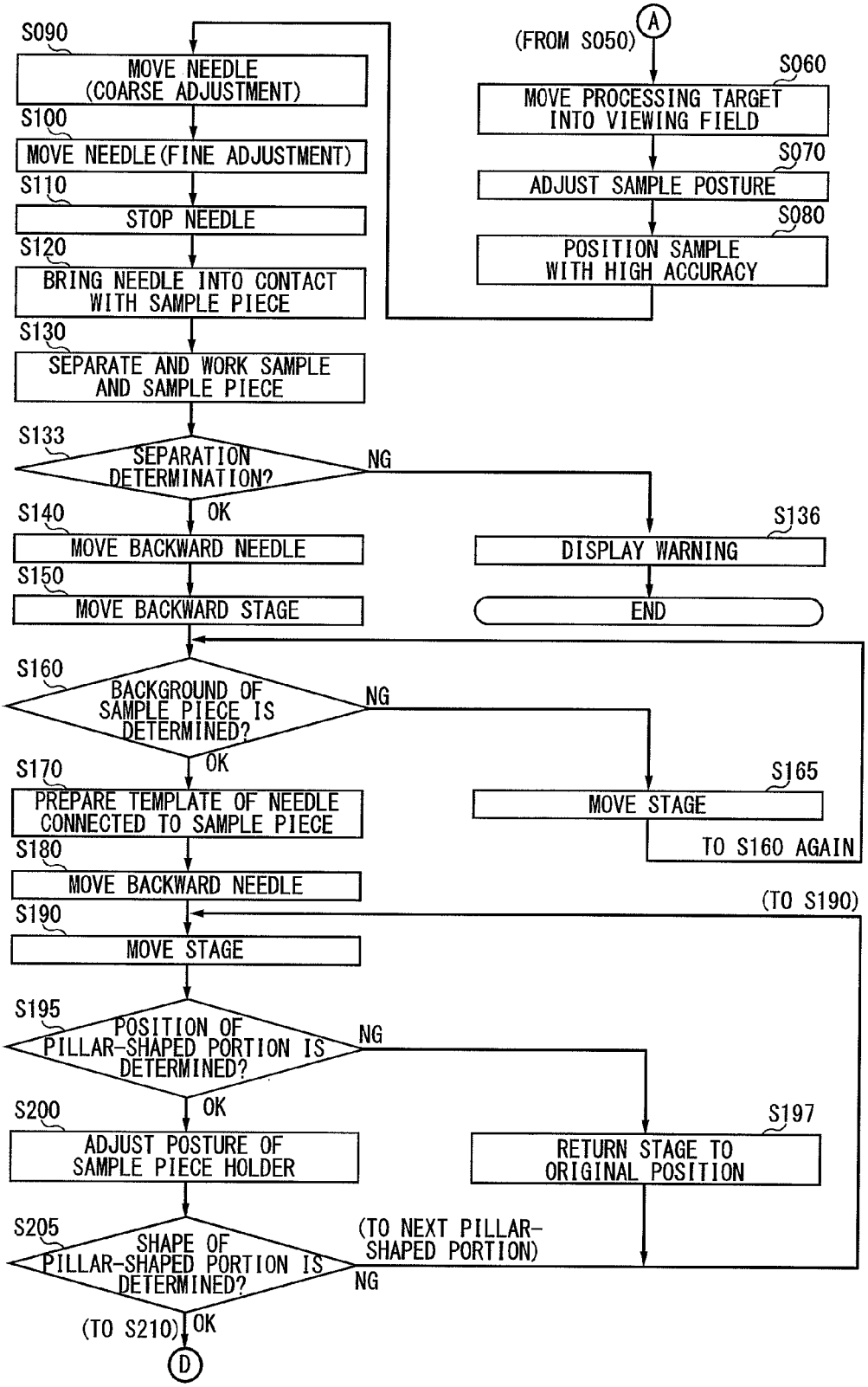
FIG. 9 is a flowchart illustrating particularly a sample piece pickup step in the flowchart illustrating the process flow of the charged particle beam apparatus according to the embodiment of the present invention.

FIG. 9 is a flowchart illustrating a flow of a step of picking up a sample piece Q from a sample S in the automatic sampling operation which is performed by the charged particle beam apparatus 10 according to the embodiment of the present invention. Here, "pickup" refers to separation and extraction of a sample piece Q from a sample S by processing using a focused ion beam or by a needle.

First, the computer 22 moves the stage 12 using the stage actuating mechanism 13 such that a sample piece Q as a target enters the field of a charged particle beam. The stage actuating mechanism 13 may be activated using the positional coordinate of a target reference mark Ref.

Then, the computer 22 recognizes the reference mark Ref formed in the sample S in advance using image data of a charged particle beam. The computer 22 recognizes the position of the sample piece Q from the relative positional relationship between the known reference mark Ref and the sample piece Q using the recognized reference mark Ref and moves the stage such that the position of the sample piece Q enters the observation field (step S060).

Then, the computer 22 actuates the stage 12 using the stage actuating mechanism 13 and rotates the stage 12 around the Z axis by an angle corresponding to the posture control mode such that the posture of the sample piece Q becomes a predetermined posture (for example, a posture suitable for extraction by the needle 18) (step S070).

Then, the computer 22 recognizes the reference mark Ref using the image data of the charged particle beam, recognizes the position of the sample piece Q from the relative positional relationship between the known reference mark Ref and the sample piece Q, and positions the sample piece Q (step S080). Then, the computer 22 performs the following process as a process of approaching the needle 18 to the sample piece Q.

The computer 22 performs needle movement (coarse adjustment) of moving the needle 18 using the needle actuating mechanism 19 (step S090). The computer 22 recognizes the reference mark Ref (see FIG. 2) using the image data of the sample S based on a focused ion beam and an electron beam. The computer 22 sets a movement target position AP of the needle 18 using the recognized reference mark Ref.

Here, the movement target position AP is set as a position close to the sample piece Q. The movement target position AP is set, for example, as a position close to a side of the sample piece Q opposite to the support portion Qa. The computer 22 correlates the movement target position AP with a processing frame F at the time of forming the sample piece Q in a predetermined positional relationship. The computer 22 stores information of the relative positional relationship between the processing frame F and the reference mark Ref at the time of forming the sample piece Q in the sample S by irradiation with a focused ion beam. The computer 22 moves the tip position of the needle 18 to the movement target position AP in a three-dimensional space based on the relative positional relationship among the reference mark Ref, the processing frame F, and the movement target position AP (see FIG. 2) using the recognized reference mark Ref. In moving the needle 18 three-dimensionally, the computer 22 first moves the needle 18, for example, in the X direction and the Y direction and then moves the needle 18 in the Z direction.

In moving the needle 18, the computer 22 can accurately locate a three-dimensional positional relationship between the needle 18 and the sample piece Q by observation in different directions based on an electron beam and a focused ion beam using the reference mark Ref formed in the sample S at the time of performing automatic processing of forming the sample piece Q, and can properly move the needle 18.

In the above-mentioned process, the computer 22 moves the tip position of the needle 18 to the movement target position AP in the three-dimensional space based on the relative positional relationship among the reference mark Ref, the processing frame F, and the movement target position AP using the reference mark Ref, but the present invention is not limited to this configuration. The computer 22 may move the tip position of the needle 18 to the movement target position AP in the three-dimensional space based on the relative positional relationship between the reference mark Ref and the movement target position AP without using the processing frame F.

Then, the computer 22 performs needle movement (fine adjustment) of moving the needle 18 using the needle actuating mechanism 19 (step S100). The computer 22 repeatedly performs the pattern matching using the template prepared in step S050 and moves the needle 18 from the movement target position AP to a connecting position in a three-dimensional space in a state in which the irradiation area including the movement target position AP is irradiated with a charged particle beam using the needle tip coordinate acquired in step S047 as the tip position of the needle 18 in an SEM image.

Then, the computer 22 performs a process of stopping the movement of the needle 18 (step S110).

Figure 10:
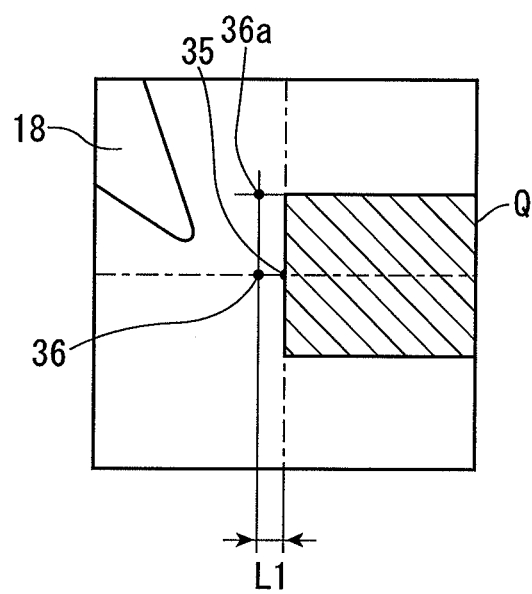
FIG. 10 is a diagram schematically illustrating a stop position of the needle when the needle is connected to the sample piece in the charged particle beam apparatus according to the embodiment of the present invention.

FIG. 10 is a diagram illustrating a positional relationship when a needle is connected to a sample piece, where an end of the sample piece Q is enlarged. In FIG. 10, an end (end face) of the sample piece Q to be connected to the needle 18 is disposed at a SIM image center 35 and, for example, a position at the center in the width direction of the sample piece Q with a gap of a predetermined distance L1 from the SIM image center 35 is set as a connecting position 36. The connecting position may be a position on an extension (denoted by reference sign 36a in FIG. 10) of the end face of the sample piece Q. In this case, a deposition layer can be easily attached at that position, which is convenient. The computer 22 sets the upper limit of the predetermined distance L1 to 1 μm and preferably sets the predetermined distance to be equal to or more than 100 nm and equal to or less than 400 nm. When the predetermined distance is less than 100 nm, there is a high risk that only the connected deposition layer is not cut but the needle 18 is also cut in separating the needle 18 from the sample piece Q. The cutting of the needle 18 shortens the needle 18 and increases the thickness of the needle tip. Accordingly, when this operation is repeated, the needle 18 has to be replaced, which is contrary to the repeated automatic sampling as the object of the present invention. On the other hand, when the predetermined distance is more than 400 nm, the connection using the deposition layer is not sufficient and there is a high risk that the extraction of the sample piece Q fails, thereby hindering the repeated sampling.

Although not illustrated in FIG. 10, but the position in the depth direction is determined in advance to be a position corresponding to a half of the width of the sample piece Q. The position in the depth direction is not limited to this position. The three-dimensional coordinate of the connecting position 36 is stored in the computer 22.

The computer 22 designates a preset connecting position 36. The computer 22 activates the needle actuating mechanism 19 to move the needle 18 to a predetermined connecting position 36 based on the three-dimensional coordinates of the tip of the needle 18 and the connecting position 36 in the same SIM image or SEM image. The computer 22 stops the needle actuating mechanism 19 when the needle tip matches the connecting position 36.

Figure 11:
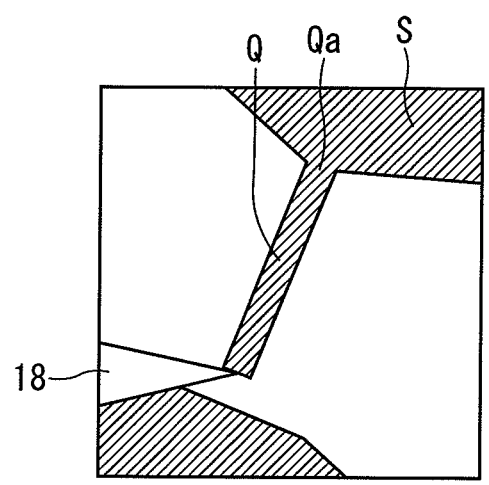
FIG. 11 is a diagram illustrating a tip of the needle and the sample piece in an image which is acquired using a focused ion beam in the charged particle beam apparatus according to the embodiment of the present invention.
Figure 12:
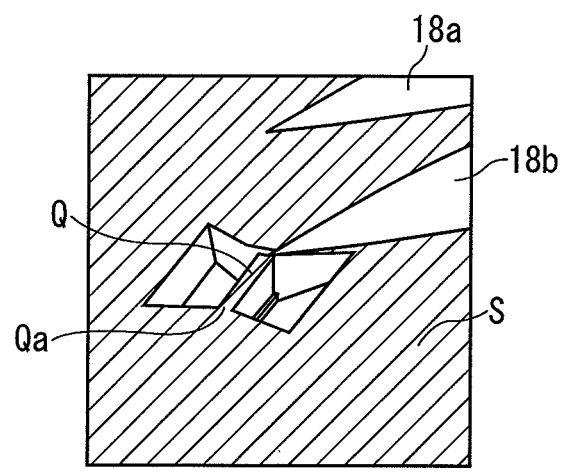
FIG. 12 is a diagram illustrating a tip of the needle and the sample piece in an image which is acquired using an electron beam in the charged particle beam apparatus according to the embodiment of the present invention.

FIGS. 11 and 12 illustrate a state in which the needle 18 approaches the sample piece Q, where FIG. 11 is a diagram illustrating an image which is acquired using a focused ion beam in the charged particle beam apparatus 10 according to the embodiment of the present invention and FIG. 12 is a diagram illustrating an image which is acquired using an electron beam. FIG. 12 illustrates a state of a needle before and after the fine adjustment, where a needle 18a in FIG. 12 indicates the needle 18 located at the movement target position AP, a needle 18b indicates the needle 18 moved to the connecting position 36 after finely adjusting the needle 18, and both needles are the same needle 18. FIGS. 11 and 12 are different from each other in observation magnification as well as in observation direction using a focused ion beam and an electron beam, but both drawings are equal to each other in the observation target and the needle 18.

By employing this method of moving the needle 18, it is possible to accurately and rapidly approach the needle 18 to the connecting position 36 in the vicinity of the sample piece Q or to accurately and rapidly stop the needle 18 at that position.

Then, the computer 22 performs a process of connecting the needle 18 to the sample piece Q (step S120). The computer 22 irradiates an irradiation area including a processing frame R1 set at the connecting position 36 with a focused ion beam while supplying carbon-based gas as deposition gas to the sample piece Q and the tip surface of the needle 18 using the gas supply unit 17 for a predetermined time. Accordingly, the computer 22 connects the sample piece Q and the needle 18 to each other with a deposition layer.

Figure 13:
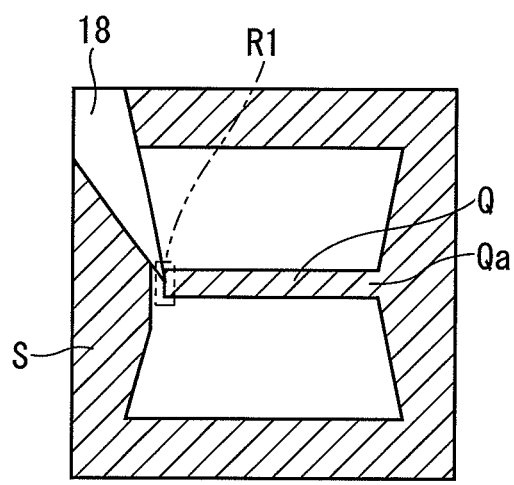
FIG. 13 is a diagram illustrating a processing frame including a connecting position of the needle and the sample piece in an image which is acquired using a focused ion beam in the charged particle beam apparatus according to the embodiment of the present invention.
Figure 14:
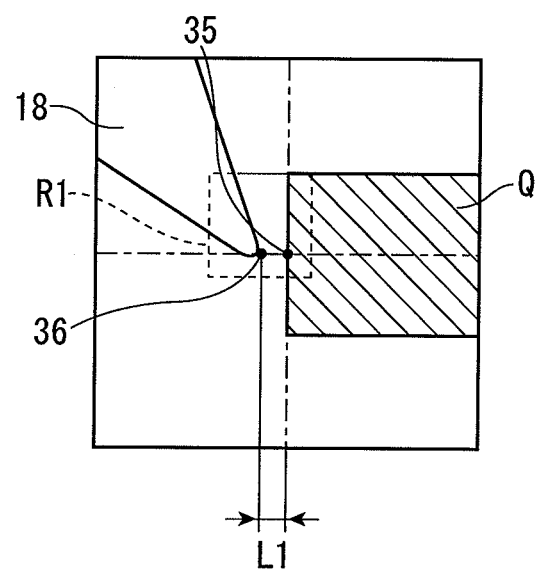
FIG. 14 is a diagram schematically illustrating a positional relationship between the needle and the sample piece and a deposition layer forming area when the needle is connected to the sample piece in the charged particle beam apparatus according to the embodiment of the present invention.

In step S120, since the computer 22 does not bring the needle 18 into direct contact with the sample piece Q but connects the needle 18 and the sample piece Q to each other with the deposition layer at a position at which both are separated by a gap, the needle 18 is not cut when the needle 18 and the sample piece Q are separated from each other by cutting based on irradiation with a focused ion beam in a subsequent step. It is also possible to prevent occurrence of a problem such as damages due to direct contact of the needle 18 with the sample piece Q. In addition, even when the needle 18 vibrates, it is possible to suppress transmission of the vibration to the sample piece Q. Even when the sample piece Q is moved due to a creep phenomenon of the sample S, it is possible to suppress an excessive deformation between the needle 18 and the sample piece Q. FIG. 13 illustrates this state and is a diagram illustrating a processing frame R1 (deposition layer forming area) including the connecting position of the needle 18 and the sample piece Q in the image data acquired using a focused ion beam in the charged particle beam apparatus 10 according to the embodiment of the present invention. FIG. 14 is an enlarged view of FIG. 13, where the positional relationship among the needle 18, the sample piece Q, and the deposition layer forming area (for example, the processing frame R1) can be easily located. The needle 18 approaches the position with a gap of a predetermined distance L1 from the sample piece Q as the connecting position and stops at that position. The deposition layer forming area (for example, the processing frame R1) for the needle 18 and the sample piece Q is set over the needle 18 and the sample piece Q. The deposition layer is formed in the gap of the predetermined distance L1 and the needle 18 and the sample piece Q are connected to each other with the deposition layer.

In connecting the needle 18 to the sample piece Q, the computer 22 causes the needle and the sample piece to take connection postures corresponding to the approach modes selected in advance in step S010 when the sample piece Q connected to the needle 18 is transferred to the sample piece holder P later. The computer 22 causes the needle and the sample piece to take the relative connection postures between the needle 18 and the sample piece Q to correspond to plural (for example, three) different approach modes to be described later.

The computer 22 may determine the connection state using the deposition layer by detecting a variation in absorbed current of the needle 18. The computer 22 determines that the sample piece Q and the needle 18 are connected with the deposition layer when the absorbed current of the needle 18 reaches a predetermined current value, and may stop formation of the deposition layer regardless of the lapse of a predetermined deposition time.

Figure 15:
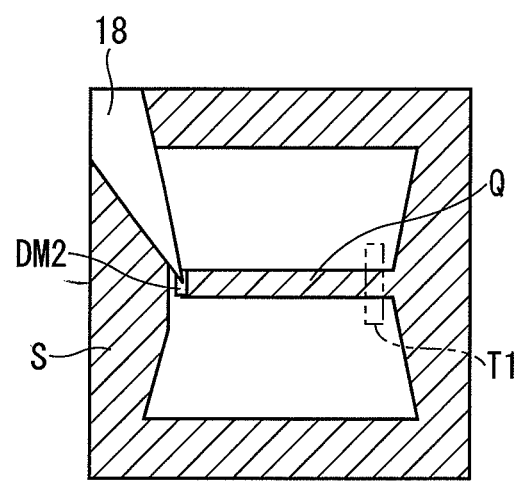
FIG. 15 is a diagram illustrating a cutting position between a sample and a support portion of the sample piece in an image which is acquired using a focused ion beam in the charged particle beam apparatus according to the embodiment of the present invention.

Then, the computer 22 performs a process of cutting the support portion Qa between the sample piece Q and the sample S (step S130). The computer 22 designates a preset cutting position T1 of the support portion Qa using the reference mark Ref formed in the sample S. The computer 22 separates the sample piece Q from the sample S by irradiating the cutting position T1 with a focused ion beam for a predetermined time. FIG. 15 illustrates this state and is a diagram illustrating the cutting position T1 of the support portion Qa between the sample S and the sample piece Q in the image data acquired using a focused ion beam in the charged particle beam apparatus 10 according to the embodiment of the present invention.

The computer 22 determines whether the sample piece Q is separated from the sample S by detecting electrical connection between the sample S and the needle 18 (step S133).

The computer 22 determines that the sample piece Q is separated from the sample S (OK) when the electrical connection between the sample S and the needle 18 is not detected, and continues to perform the subsequent processes. On the other hand, the computer 22 determines that the sample piece Q is not separated from the sample S (NG) when the electrical connection between the sample S and the needle 18 is detected after the cutting is completed, that is, after the cutting of the support portion Qa between the sample piece Q and the sample S at the cutting position T1 is completed. When it is determined that the sample piece Q is not separated from the sample S (NG), the computer 22 informs that the separation of the sample piece Q and the sample S is not completed through display on the display device 21 or warning sound (step S136). Then, performing of the subsequent processes is stopped. In this case, the computer 22 may cut a deposition layer DM1 connecting the sample piece Q and the needle 18 by irradiation with a focused ion beam, may separate the sample piece Q from the needle 18, and may return the needle 18 to the initial position (step S060). The needle 18 returned to the initial position performs sampling of a next sample piece Q.

Figure 16:
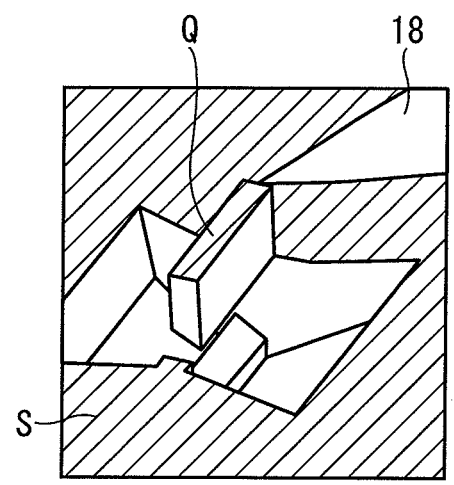
FIG. 16 is a diagram illustrating a state in which the needle connected to the sample piece is moved backward in an image which is acquired using an electron beam in the charged particle beam apparatus according to the embodiment of the present invention.

Then, the computer 22 performs a process of moving the needle backward (step S140). The computer 22 moves upward the needle 18 in the vertical direction (that is, the positive Z direction) by a predetermined distance (for example, 5 μm) using the needle actuating mechanism 19. FIG. 16 illustrates this state and is a diagram illustrating a state in which the needle 18 connected to the sample piece Q is moved backward in the image data acquired using an electron beam in the charged particle beam apparatus 10 according to the embodiment of the present invention.

Figure 17:
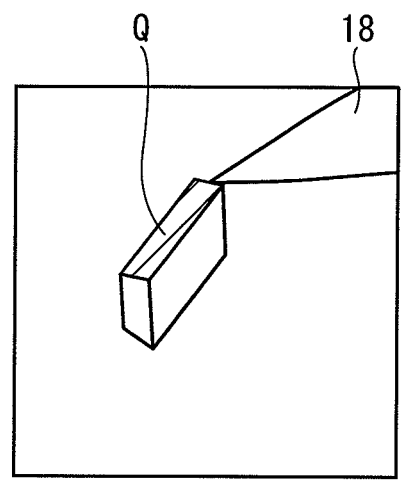
FIG. 17 is a diagram illustrating a state in which a stage is moved backward with respect to the needle connected to the sample piece in an image which is acquired using an electron beam in the charged particle beam apparatus according to the embodiment of the present invention.

Then, the computer 22 performs a process of moving backward the stage (step S150). As illustrated in FIG. 17, the computer 22 moves the stage 12 by a predetermined distance using the stage actuating mechanism 13. For example, the stage 12 is moved downward in the vertical direction (that is, the negative Z direction) by 1 mm, 3 mm, or 5 mm. After the stage 12 is moved downward by the predetermined distance, the computer 22 brings the nozzle 17a of the gas supply unit 17 apart from the stage 12. For example, the nozzle 17a is moved upward to a waiting position in the vertical direction. FIG. 17 illustrates this state and is a diagram illustrating a state in which the stage 12 is moved backward relative to the needle 18 connected to the sample piece Q in the image data acquired using an electron beam in the charged particle beam apparatus 10 according to the embodiment of the present invention.

Then, the computer 22 causes the stage actuating mechanism 13 to operate such that no structure is present in the background of the needle 18 and the sample piece Q connected to each other. This is to satisfactorily recognize edges (profiles) of the needle 18 and the sample piece Q from the image data of the sample piece Q acquired using a focused ion beam and an electron beam in preparing templates of the needle 18 and the sample piece Q in a subsequent process (step). The computer 22 moves the stage 12 by a predetermined distance. The computer 22 determines the background of the sample piece Q (step S160), performs the process of subsequent step S170 when there is no problem in the background, moves again the stage 12 by a predetermined distance and determines the background again (step S160) when there is a problem in the background (step S165), and repeats these steps until there is no problem in the background.

The computer 22 performs a process of preparing templates of a needle and a sample piece (step S170). The computer 22 prepares templates of the needle 18 and the sample piece Q in a posture (that is, a posture in which the sample piece Q is connected to a pillar-shaped portion 34 of the sample mount 33) in which the needle 18 having the sample piece Q fixed thereto is rotated as needed. Accordingly, the computer 22 three-dimensionally recognizes the edges (profiles) of the needle 18 and the sample piece Q from the image data acquired using a focused ion beam and an electron beam with the rotation of the needle 18. The computer 22 may recognize the edges (profiles) of the needle 8 and the sample piece Q from the image data acquired using a focused ion beam without using an electron beam in the approach mode at a rotation angle of 0° of the needle 18.

When the computer 22 instructs the stage actuating mechanism 13 or the needle actuating mechanism 19 to move the stage 12 to a position at which no structure is present in the background of the needle 18 and the sample piece Q, but the needle 18 does not actually reach the instructed position, the computer 22 sets an observation magnification to a low magnification, finds the needle 18, initializes the positional coordinate of the needle 18 when the needle 18 is not found, and moves the needle 18 to the initial position.

In preparing the templates (step S170), first, the computer 22 acquires a template-matching template (reference image data) for tip shapes of the sample piece Q and the needle 18 connected to the sample piece Q. The computer 22 irradiates the needle 18 with a charged particle beam (a focused ion beam and an electron beam) while scanning the irradiation position. The computer 22 acquires image data in different directions of secondary charged particles R (such as secondary electrons) emitted from the needle 18 in response to the irradiation with the charged particle beam. The computer 22 acquires the image data by irradiation with a focused ion beam and irradiation with an electron beam. The computer 22 stores the image data acquired in two different directions as templates (reference image data).

Since the computer 22 sets image data, which are actually acquired for the sample piece Q actually worked using a focused ion beam and the needle 18 connected to the sample piece Q, as the reference image data, the computer 22 can perform accurate pattern matching without depending on the shapes of the sample piece Q and the needle 18.

In acquiring the image data, the computer 22 uses image acquisition conditions such as appropriate magnification, luminance, and contrast stored in advance to enhance a degree of recognition of the shapes of the sample piece Q and the needle 18 connected to the sample piece Q.

Then, the computer 22 performs a process of moving backward the needle (step S180). This process is performed to prevent an undesired contact with the stage in moving the stage to be described later. The computer 22 moves the needle 18 by a predetermined distance using the needle actuating mechanism 19. For example, the needle is moved upward in the vertical direction (that is, the positive Z direction). On the contrary, the needle 18 is stopped and the stage 12 is moved by a predetermined distance. For example, the stage 12 may be moved downward in the vertical direction (that is, the negative Z direction). The needle moving direction is not limited to the vertical direction, but may be a needle axis direction or other moved positions, as long as it is a predetermined position at which the sample piece Q attached to the tip of the needle does not come in contact with a structure in the sample chamber or is not irradiated with a focused ion beam.

Figure 18:
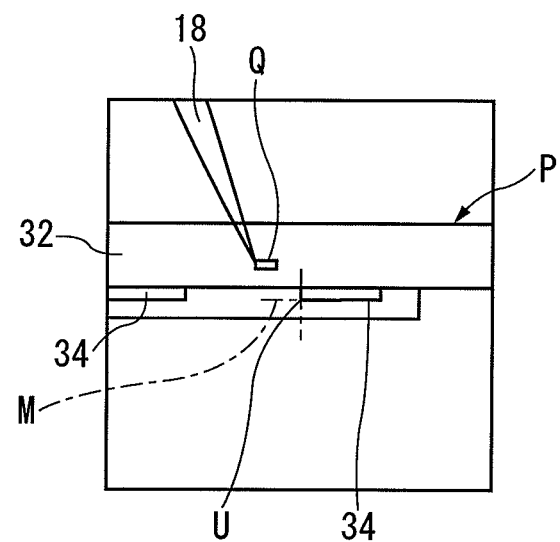
FIG. 18 is a diagram illustrating a position of a pillar-shaped portion at which the sample piece is mounted in an image which is acquired using a focused ion beam in the charged particle beam apparatus according to the embodiment of the present invention.
Figure 19:
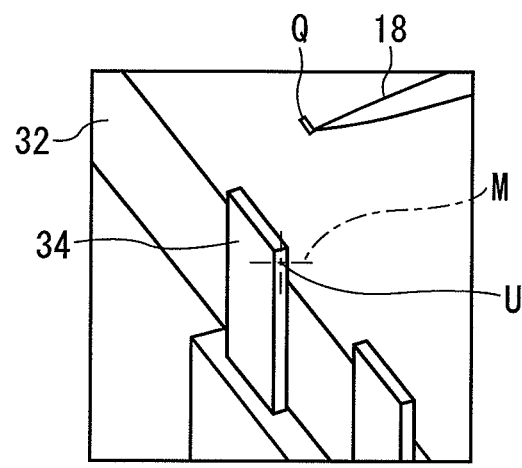
FIG. 19 is a diagram illustrating a position of a pillar-shaped portion at which the sample piece is mounted in an image which is acquired using an electron beam in the charged particle beam apparatus according to the embodiment of the present invention.

Then, the computer 22 moves the stage 12 using the stage actuating mechanism 13 such that a specific sample piece holder P registered in step S020 enters the observation field area based on a charged particle beam (step S190). FIGS. 18 and 19 illustrate this state. Specifically, FIG. 18 is a schematic diagram of an image which is acquired using a focused ion beam in the charged particle beam apparatus 10 according to the embodiment of the present invention, where an attachment position U of a sample piece Q in a pillar-shaped portion 34 is illustrated. FIG. 19 is a diagram illustrating an image which is acquired using an electron beam, where the attachment position U of the sample piece Q in the pillar-shaped portion 34 is illustrated.

Here, it is determined whether a desired pillar-shaped portion 34 of the sample piece holder P enters an observation field area (step S195), and the process flow moves to step S200 when the desired pillar-shaped portion 34 enters the observation field area. When the desired pillar-shaped portion 34 does not enter the observation field area, that is, when the stage is not correctly driven with respect to a designated coordinate, the previously-designated stage coordinate is initialized and the stage 12 is returned to the original position (step S197). Then, the coordinate of the desired pillar-shaped portion 34 registered in advance is designated again, the stage 12 is driven (step S190) until the pillar-shaped portion 34 enters the observation field area.

Then, the computer 22 moves the stage 12 using the stage actuating mechanism 13 to adjust the horizontal position of the sample piece holder P and rotates and tilts the stage 12 by an angle corresponding to the posture control mode such that the posture of the sample piece holder P becomes a predetermined posture (step S200).

According to step S200, the postures of the sample piece Q and the sample piece holder P can be adjusted such that the surface end of the original sample S is parallel or perpendicular to the end face of the pillar-shaped portion 34. Specifically, on the assumption that the sample piece Q fixed to the pillar-shaped portion 34 is subjected to a thinning process using a focused ion beam, it is preferable that the postures of the sample piece Q and the sample piece holder P be adjusted such that the surface end of the original sample S and a focused ion beam irradiation axis are perpendicular to each other. It is also preferable that the postures of the sample piece Q and the sample piece holder P be adjusted such that the surface end of the original sample S is perpendicular to the pillar-shaped portion 34 and the sample piece Q fixed to the pillar-shaped portion 34 is located downstream in a focused ion beam incidence direction.

Here, it is determined whether the shape of the pillar-shaped portion 34 in the sample piece holder P is good or bad (step S205). The image of the pillar-shaped portion 34 is registered in step S023, but whether the designated pillar-shaped portion 34 is deformed, destroyed, or missed due to an unexpected contact or the like in the subsequent process is determined depending on whether the shape of the pillar-shaped portion 34 is good or bad in step S205. When it is determined in step S205 that the shape of the pillar-shaped portion 34 has no problem but is good, the process flow moves to step S210. When it is determined that the shape of the pillar-shaped portion 34 is bad, the process flow is returned to step S190 of moving the stage such that a next pillar-shaped portion 34 enters the observation field area.

When the computer 22 instructs the stage actuating mechanism 13 to move the stage 12 such that the designated pillar-shaped portion 34 enter the observation field area, but the designated pillar-shaped portion 34 does not actually enter the observation field area, the computer 22 initializes the positional coordinate of the stage 12 and moves the stage 12 to the initial position.

Then, the computer 22 moves the nozzle 17*a* of the gas supply unit 17 to the vicinity of the focused ion beam irradiation position. For example, the nozzle 17*a* is moved from the waiting position above the stage 12 in the vertical direction to the processing position.

Sample Piece Mounting Step

Here, the "sample piece mounting step" is a step of transferring an extracted sample piece Q to the sample piece holder P.

FIG. 20 is a flowchart illustrating a flow of a process of mounting (transferring) a sample piece Q on a predetermined pillar-shaped portion 34 in the sample piece holder P in the automatic sampling operation of the charged particle beam apparatus 10 according to the embodiment of the present invention.

The computer 22 recognizes the previous position of the sample piece Q stored in step S020 using image data acquired by irradiation with a focused ion beam and an electron beam (step S210). The computer 22 performs template matching of the pillar-shaped portion 34. The computer 22 performs the template matching so as to check that the pillar-shaped portion 34 appearing in the observation field area among the plural pillar-shaped portions 34 of the sample mount 33 having a comb-teeth shape is the designated pillar-shaped portion 34. The computer 22 performs the template matching with the image data acquired by irradiation with a focused ion beam and an electron beam using the templates of the pillar-shaped portions 34 prepared in the step (step S020) of preparing the templates of the pillar-shaped portions 34 in advance.

The computer 22 determines whether a problem such as missing is present in the pillar-shaped portion 34 in the template matching for each pillar-shaped portion 34 which is performed after the stage 12 is moved (step S215). When a problem is present in the shape of the pillar-shaped portion 34 (NG), the pillar-shaped portion 34 to which the sample piece Q is transferred is changed to a pillar-shaped portion 34 in the vicinity of the pillar-shaped portion 34 having a problem and the template matching is performed on the pillar-shaped portion 34 to determine the pillar-shaped portion 34 to be transferred. When there is no problem in the shape of the pillar-shaped portion 34, the process flow moves to step S220.

The computer 22 may extract the edge (profile) from the image data of a predetermined area (an area including at least the pillar-shaped portion 34) and may set the edge pattern as the template. When the edge (profile) may not be extracted from the image data of the predetermined area (the area including at least the pillar-shaped portion 34), the computer 22 acquires image data again. The extracted edge is displayed on the display device 21 and the template matching with an image based on a focused ion beam or an image based on an electron beam in the observation field area may be performed.

The computer 22 actuates the stage 12 using the stage actuating mechanism 13 such that the attachment position recognized by irradiation with an electron beam and the attachment position recognized by irradiation with a focused ion beam match each other. The computer 22 actuates the stage 12 using the stage actuating mechanism 13 such that the attachment position U of the sample piece Q matches the center (processing position) of the field area.

Then, the computer 22 performs the processes of steps S220 to S250 as a process of bringing the sample piece Q connected to the needle 18 into contact with the sample piece holder P.

First, the computer 22 recognizes the position of the needle 18 (step S220). The computer 22 detects the absorbed current flowing into the needle 18 by irradiating the needle 18 with a charged particle beam and generates absorbed current image data. The computer 22 acquires image data by irradiation with a focused ion beam and irradiation with an electron beam. The computer 22 detects the tip position of the needle 18 in a three-dimensional space using the absorbed current image data from two different directions.

The computer 22 may actuate the stage 12 using the stage actuating mechanism 13 based on the detected tip position of the needle 18 and may set the tip position of the needle 18 to the preset center position of the field area (field center).

Then, the computer 22 performs the sample piece mounting step. First, the computer 22 performs the template matching so as to accurately recognize the position of the sample piece Q connected to the needle 18. The computer 22 performs the template matching in the image data acquired by irradiation with a focused ion beam and irradiation with an electron beam using the templates of the needle 18 and the sample piece Q connected to each other which are prepared in advance in the step of preparing templates the needle and the sample piece.

When the edge (profile) is extracted from a predetermined area (an area including at least the needle 18 and the sample piece Q) of the image data in the template matching, the computer 22 displays the extracted edge (profile) on the display device 21. When the edge (profile) may not be extracted from a predetermined area (an area including at least the needle 18 and the sample piece Q) of the image data in the template matching, the computer 22 acquires image data again.

Then, the computer 22 measures the distance between the sample piece Q and the pillar-shaped portion 34 based on the template matching using the templates of the needle 18 and the sample piece Q connected to each other and the templates of the pillar-shaped portion 34 to which the sample piece Q is attached in the image data acquired by irradiation with a focused ion beam and an electron beam.

Then, the computer 22 finally transfers the sample piece Q to the pillar-shaped portion 34 to which the sample piece Q is attached with only movement in a plane parallel to the stage 12.

In the sample piece mounting step, first, the computer 22 performs needle movement of moving the needle 18 using the needle actuating mechanism 19 (step S230). The computer 22 measures the distance between the sample piece Q and the pillar-shaped portion 34 based on the template matching using the templates of the needle 18 and the sample piece Q and the templates of the pillar-shaped portion 34 in the image data acquired by irradiation with a focused ion beam and an electron beam. The computer 22 moves the needle 18 to the attachment position of the sample piece Q in the three-dimensional space based on the measured distance.

Then, the computer 22 stops the needle 18 with a predetermined gap L2 between the pillar-shaped portion 34 and the sample piece Q (step S240). The computer 22 sets the gap L2 to be equal to or less than 1 μm and sets the gap L2 to be preferably equal to or more than 100 nm and equal to or less than 500 nm. Even when the gap L2 is equal to or more than 500 nm, the connection can be achieved, but the time required for connecting the sample piece Q to the pillar-shaped portion 34 using the deposition layer is longer than a predetermined value and thus 1 μm is not preferable. As the gap L2 becomes smaller, the time required for connecting the sample piece Q to the pillar-shaped portion 34 using the deposition layer becomes shorter, but it is important not to come in contact with each other.

The computer 22 may form the gap therebetween by detecting the absorbed current images of the pillar-shaped portion 34 and the needle 18 in forming the gap L2.

The computer 22 detects whether the sample piece Q and the needle 18 are separated from each other after the sample piece Q is transferred to the pillar-shaped portion 34 by detecting electrical connection between the pillar-shaped portion 34 and the needle 18 or the absorbed current images of the pillar-shaped portion 34 and the needle 18.

When the electrical connection between the pillar-shaped portion 34 and the needle 18 may not be detected, the compute 22 switches the process to detect the absorbed current images of the pillar-shaped portion 34 and the needle 18.

When the electrical connection between the pillar-shaped portion 34 and the needle 18 may not be detected, the computer 22 may stop transferring of the sample piece Q and may separate the sample piece Q from the needle 18, and may perform a needle trimming step to be described later.

Figure 21:
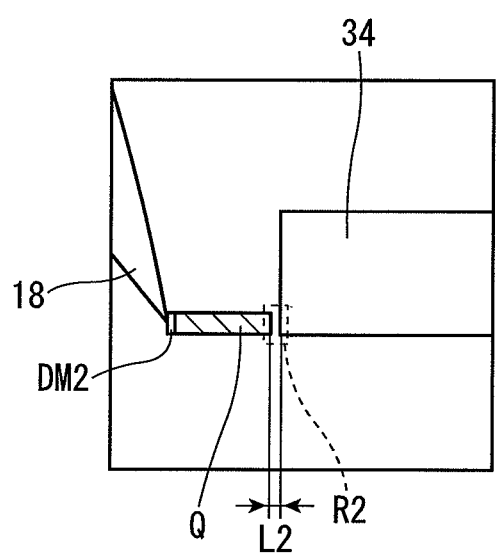
FIG. 21 is a diagram illustrating the needle which is stopped in the vicinity of a position of a sample mount at which the sample piece is mounted in an image which is acquired using a focused ion beam in the charged particle beam apparatus according to the embodiment of the present invention.
Figure 22:
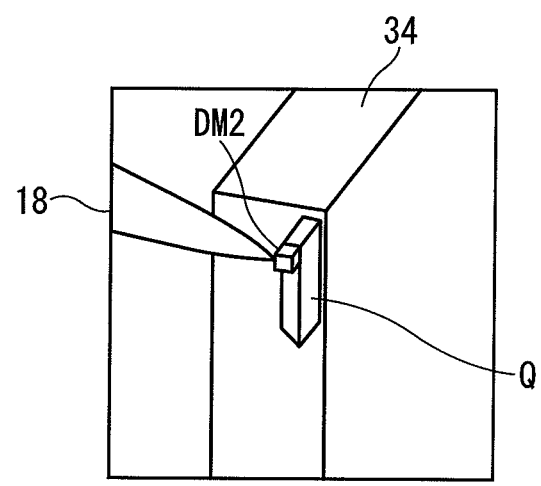
FIG. 22 is a diagram illustrating the needle which is stopped in the vicinity of a position of a sample mount at which the sample piece is mounted in an image which is acquired using an electron beam in the charged particle beam apparatus according to the embodiment of the present invention.

Then, the computer 22 performs a process of connecting the sample piece Q connected to the needle 18 to the pillar-shaped portion 34 (step S250). FIGS. 21 and 22 are diagrams schematically illustrating images in which the observation magnification in FIGS. 18 and 19 is raised. The computer 22 causes the sample piece Q and the pillar-shaped portion 34 to approach each other such that one side of the sample piece Q and one side of the pillar-shaped portion 34 form a straight line as illustrated in FIG. 21 and such that the top surface of the sample piece Q and the top surface of the pillar-shaped portion 34 are flush with each other, and stops the needle actuating mechanism 19 when the gap L2 reaches a predetermined value. The computer 22 sets a deposition processing frame R2 so as to include the end of the pillar-shaped portion 34 in the image based on the focused ion beam in FIG. 21 in a state in which the sample piece Q is stopped at the attachment position of the sample piece with the gap L2. The computer 22 irradiates the irradiation area including the processing frame R2 with a focused ion beam for a predetermined time while supply gas to the surfaces of the sample piece Q and the pillar-shaped portion 34 from the gas supply unit 17. By this operation, a deposition layer is formed in a part irradiated with the focused ion beam, the gap L2 is filled, and the sample piece Q is connected to the pillar-shaped portion 34. The computer 22 ends the deposition when electrical connection between the pillar-shaped portion 34 and the needle 18 is detected in the step of fixing the sample piece Q to the pillar-shaped portion 34 by the deposition.

The computer 22 determines whether the connection between the sample piece Q and the pillar-shaped portion 34 is completed (step S255). The process of step S255 is performed, for example, as follows. An ohmmeter is disposed between the needle 18 and the stage 12 in advance and electrical connection therebetween is detected. When both are separated from each other (the gap L2 is present), the electrical resistance is infinite. As both are covered with the conductive deposition layer and the gap L2 is filled, the electrical resistance value therebetween slowly decreases. When it is detected that the electrical resistance value therebetween becomes equal to or less than a predetermined resistance value, it is determined that both are electrically connected to each other. From preliminary studies, it can be determined that the deposition layer has a mechanically-adequate strength and the sample piece Q is satisfactorily connected to the pillar-shaped portion 34, when the resistance value therebetween reaches a predetermined resistance value.

The physical quantity to be detected is not limited to the electrical resistance, but electrical characteristics between the pillar-shaped portion and the sample piece Q such as a current or a voltage can be used as long as they can be measured. When predetermined electrical characteristics (such as an electrical resistance value, a current value, and a potential) are not satisfied within a predetermined time, the computer 22 extends the deposition layer forming time. The computer 22 can acquire times in which an optimal deposition layer can be formed depending on the gap L2 between the pillar-shaped portion 34 and the sample piece Q, the beam irradiation conditions, and the types of gas for the deposition layer, can store the deposition layer forming time, and can stop formation of the deposition layer in a predetermined time.

Figure 23:
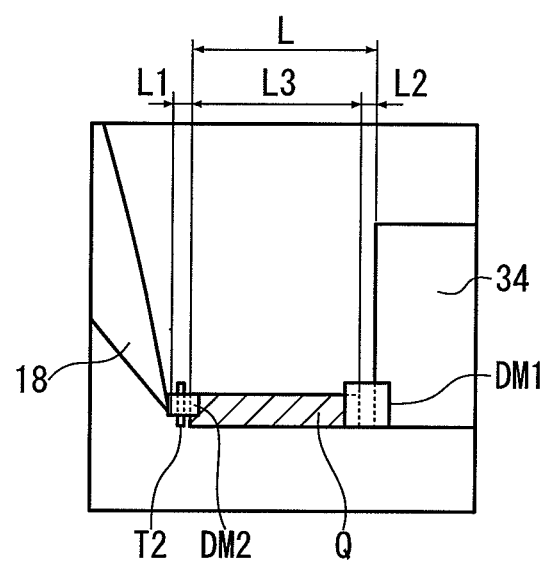
FIG. 23 is a diagram illustrating a processing frame for connecting the sample piece connected to the needle to a sample mount in an image which is acquired using a focused ion beam in the charged particle beam apparatus according to the embodiment of the present invention.

The computer 22 stops supply of gas and irradiation with a focused ion beam when the connection between the sample piece Q and the pillar-shaped portion 34 is detected. FIG. 23 illustrates this state and is a diagram illustrating a deposition layer DM1 connecting the sample piece Q connected to the needle 18 to the pillar-shaped portion 34 in the image data based on a focused ion beam in the charged particle beam apparatus 10 according to the embodiment of the present invention.

In step S255, the computer 22 may determine the connection state using the deposition layer DM1 by detecting a variation in the absorbed current of the needle 18. When it is determined depending on the variation in the absorbed current of the needle 18 that the sample piece Q and the pillar-shaped portion 34 are connected to each other with the deposition layer DM1, the computer 22 may stop formation of the deposition layer DM1 without depending on whether a predetermined time elapses. When the completion of connection can be confirmed, the process flow moves to step S260. When the completion of connection is not confirmed, the irradiation with a focused ion beam and the supply of gas are stopped in a predetermined time, the deposition layer DM2 connecting the sample piece Q and the needle 18 is cut with a focused ion beam, and the sample piece Q at the needle tip is discarded. Then, the process flow moves to an operation of moving the needle backward (step S270).

Then, the computer 22 performs the process of cutting the deposition layer DM2 connecting the needle 18 and the sample piece Q and separating the sample piece Q and the needle 18 from each other (step S260). FIG. 23 illustrates this state and is a diagram illustrating a cutting position T2 for cutting the deposition layer DM2 connecting the needle 18 and the sample piece Q in the image data acquired using a focused ion beam in the charged particle beam apparatus 10 according to the embodiment of the present invention. The computer 22 sets a position, which is separated from the side surface of the pillar-shaped portion 34 by a sum (L+L1/2) of a predetermined distance (that is, the sum of the gap L2 from the side surface of the pillar-shaped portion 34 to the sample piece Q and the size L3 of the sample piece Q) L and half a predetermined distance L1 (see FIG. 23) of the gap between the needle 18 and the sample piece Q, as the cutting position T2. The cutting position T2 may be set to a position which is separated by a sum of the predetermined distance L and the predetermined distance L1 of the gap between the needle 18 and the sample piece Q. In this case, the carbon-deposition layer DM2 remaining at the needle tip decreases and the opportunities of an operation of cleaning the needle 18 (to be described later) decrease, which is preferable in the continuous automatic sampling.

Figure 24:
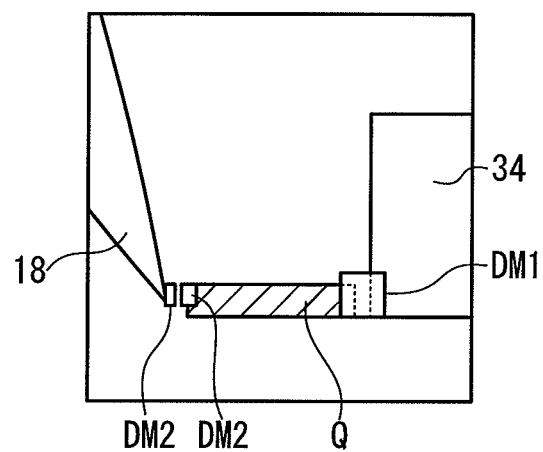
FIG. 24 is a diagram illustrating a cutting position at which a deposition layer connecting the needle and the sample piece is cut in an image which is acquired using a focused ion beam in the charged particle beam apparatus according to the embodiment of the present invention.

The computer 22 can separate the needle 18 from the sample piece Q by irradiating the cutting position T2 with a focused ion beam for a predetermined time. The computer 22 cuts only the deposition layer DM2 but does not cut the needle 18 to separate the needle 18 from the sample piece Q by irradiating the cutting position T2 with a focused ion beam for a predetermined time. In step S260, it is important to cut only the deposition layer DM2. Accordingly, since the needle 18 which has been set can be repeatedly used without replacement for a long time, the automatic sampling can be continuously repeated in an unmanned manner. FIG. 24 illustrates this state and is a diagram illustrating a state in which the needle 18 is separated from the sample piece Q in the image data based on a focused ion beam in the charged particle beam apparatus 10 according to the embodiment of the present invention. A residue of the deposition layer DM2 is attached to the needle tip.

The computer 22 determines whether the needle 18 is separated from the sample piece Q by detecting the electrical connection between the sample piece holder P and the needle 18 (step S265). When the electrical connection between the sample piece holder P and the needle 18 is detected after the cutting is completed, that is, after the irradiation with a focused ion beam is performed to cut the deposition layer DM2 between the needle 18 and the sample piece Q at the cutting position T2, the computer 22 determines that the needle 18 is not separated from the sample mount 33. When it is determined that the needle 18 is not separated from the sample piece holder P, the computer 22 informs the operator that the separation of the needle 18 from the sample piece Q is not completed by display on the display device 21 or by warning sound. Then, performing of subsequent processes is stopped. On the other hand, when the electrical connection between the sample piece holder P and the needle 18 is not detected, the computer 22 determines that the needle 18 is separated from the sample piece Q and continues to perform the subsequent processes.

Figure 25:
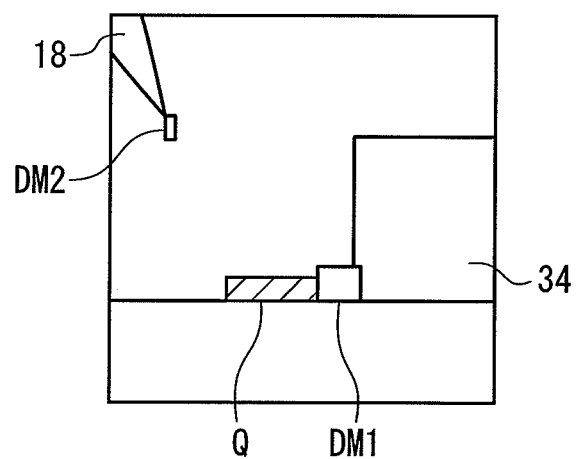
FIG. 25 is a diagram illustrating a state in which the needle is moved backward in an image which is acquired using a focused ion beam in the charged particle beam apparatus according to the embodiment of the present invention.
Figure 26:
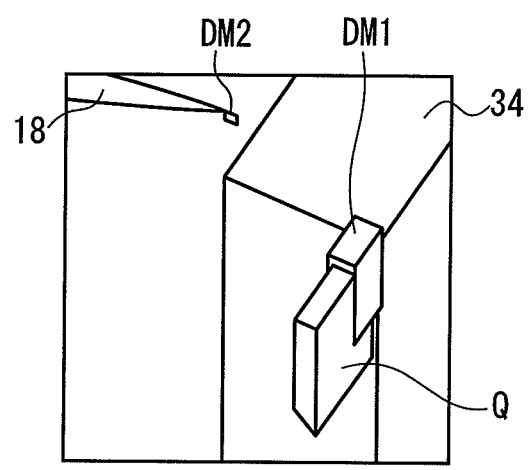
FIG. 26 is a diagram illustrating a state in which the needle is moved backward in an image which is acquired using an electron beam in the charged particle beam apparatus according to the embodiment of the present invention.

Then, the computer 22 performs a needle moving-back process (step S270). The computer 22 brings the needle 18 apart from the sample piece Q by a predetermined distance using the needle actuating mechanism 19. For example, the needle 18 is moved upward in the vertical direction, that is, in the positive Z direction by 2 mm or 3 mm. FIGS. 25 and 26 illustrate this state in which the needle 18 is moved upward from the sample piece Q, where FIG. 25 is a schematic diagram of an image based on a focused ion beam in the charged particle beam apparatus 10 according to the embodiment of the present invention and FIG. 26 is a schematic diagram based on an electron beam.

Then, it is determined whether to continue sampling from different positions of the same sample S (step S280). Since the number of sample pieces to be sampled is registered in advance in step S010, the computer 22 checks this data and performs determination of the following step. When it is determined that the sampling should be continuously performed, the process flow is returned to step S030 and the sampling operation is continuously performed in the subsequent steps. When it is determined that the sampling should not continuously performed, a series of flow is completed.

The process of preparing a template of the needle in step S050 may be performed immediately after step S280. Accordingly, in preparation of the next sampling, the process of step S050 does not need to be performed in the next sampling, thereby simplifying the process. Since the sample S is not present in the background of the needle 18, the sample S is not uselessly irradiated with a charged particle beam.

A series of automatic sampling operation is completed in this way.

The above-mentioned flow from start to end is merely an example, and some steps may be replaced or skipped without hindering the entire flow.

The computer 22 can perform the sampling operation in an unmanned manner by continuously performing the steps from start to end. According to the above-mentioned method, since the sampling can be repeated without replacing the needle 18, it is possible to continuously sample plural sample pieces Q using the same needle 18.

Accordingly, the charged particle beam apparatus 10 can repeatedly use a needle 18 without shaping or replacing the same needle 18 in separating and extracting a sample piece Q from a sample S and can automatically prepare plural sample pieces Q from a single sample S. It is possible to perform a sampling operation without performing a manual operation of an operator as in the related art.

As described above, in the charged particle beam apparatus 10 according to the embodiment of the present invention, since the computer 22 controls the focused ion beam irradiation optical system 14, the electron beam irradiation optical system 15, the stage actuating mechanism 13, the needle actuating mechanism 19, and the gas supply unit 17 by basically using at least templates acquired directly from the sample piece holder P, the needle 18, and the sample piece Q, it is possible to appropriately automate the operation of transferring a sample piece Q to the sample piece holder P.

Since a template is prepared from a secondary electron image or an absorbed current image which has been acquired by irradiation with a charged particle beam in a state in which no structure is present in the background of the sample piece holder P, the needle 18, and the sample piece Q, it is possible to improve the reliability of the template. Accordingly, it is possible to improve accuracy of the template matching using the template and thus to transfer the sample piece Q to the sample piece holder P based on position information acquired through the template matching.

When it is instructed to cause no structure to be present at least in the background of the sample piece holder P, the needle 18, and the sample piece Q but a structure is actually present, the positions of the sample piece holder P, the needle 18, and the sample piece Q are initialized and it is thus possible to return the driving mechanisms 13 and 19 to normal states.

Since a template is prepared based on a posture in transferring a sample piece Q to the sample piece holder P, it is possible to improve the positional accuracy in transferring.

Since distances are measured based on the template matching using at least the sample piece holder P, the needle 18, and the sample piece Q, it is possible to further improve the positional accuracy in transferring.

When an edge may not be extracted in a predetermined area of the image data of at least the sample piece holder P, the needle 18, and the sample piece Q, the image data is acquired again and it is thus possible to accurately prepare the templates.

Since a sample piece Q is finally transferred to a predetermined position of the sample piece holder P by only movement in a plane parallel to the stage 12, it is possible to appropriately transfer the sample piece Q.

Since the sample piece Q held by the needle 18 is shaped before preparing a template, it is possible to improve edge extraction accuracy in preparing a template and to secure a shape of a sample piece Q suitable for a finishing process which is performed later. Since the shaping position is set depending on the distance from the needle 18, it is possible to accurately perform the shaping process.

When the needle 18 holding the sample piece Q is rotated to a predetermined posture, the positional displacement of the needle 18 can be corrected by eccentricity correction.

In the charged particle beam apparatus 10 according to the embodiment of the present invention, the computer 22 can locate the relative positional relationship of the needle 18 to the sample piece Q by detecting the relative position of the needle 18 to the reference mark Ref in forming the sample piece Q. The computer 22 can appropriately (that is, without coming in contact with another member or device) drive the needle 18 in a three-dimensional space by sequentially detecting the relative position of the needle 18 to the position of the sample piece Q.

The computer 22 can accurately locate the position of the needle 18 in a three-dimensional space by using image data acquired from at least two different directions. Accordingly, the computer 22 can appropriately drive the needle 18 three-dimensionally.

The computer 22 prepares a template (reference image data) based on image data which is actually generated immediately before moving the needle 18 in advance, it is possible to perform the template matching with high matching accuracy without depending on the shape of the needle 18. Accordingly, the computer 22 can accurately locate the position of the needle 18 in a three-dimensional space and can appropriately drive the needle 18 in the three-dimensional space. Since the computer 22 acquires image data or absorbed current image data in a state in which the stage 12 is moved backward and no complicated structure is present in the background of the needle 18, it is possible to acquire a template in which the shape of the needle 18 can be clearly located with excluding an influence of the background.

Since the computer 22 connects the needle 18 and the sample piece Q with the deposition layer without coming in contact with each other, it is possible to prevent the needle 18 from being cut when the needle 18 is separated from the sample piece Q in the subsequent process. Even when the needle 18 vibrates, it is possible to suppress transmission of the vibration to the sample piece Q. Even when movement of the sample piece Q occurs due to a creep phenomenon of the sample S, it is possible to suppress excessive deformation occurring between the needle 18 and the sample piece Q.

When the connection between the sample S and the sample piece Q is cut through a sputtering process by irradiation with a focused ion beam, the computer 22 can check whether the cutting is actually completed by detecting the electrical connection between the sample S and the needle 18.

The computer 22 informs that the actual separation of the sample S and the sample piece Q is not completed. Accordingly, even when a series of processes which are automatically performed in this step are stopped, it is possible to allow a device operator to easily recognize causes of this stop.

When the electrical connection between the sample S and the needle 18 is detected, the computer 22 determines that the cutting of the connection between the sample S and the sample piece Q is not actually completed and cuts the connection between the sample piece Q and the needle 18 in preparation for subsequent driving such as backward movement of the needle 18. Accordingly, the computer 22 can prevent occurrence of a problem such as positional displacement of the sample S or destruction of the needle 18 accompanied with the driving of the needle 18.

The computer 22 can drive the needle 18 after the electrical connection between the sample piece Q and the needle 18 is detected and it is confirmed that the cutting of the connection between the sample S and the sample piece Q is actually completed. Accordingly, the computer 22 can prevent occurrence of a problem such as positional displacement of the sample S or destruction of the needle 18 accompanied with the driving of the needle 18.

Since the computer 22 prepares a template of the needle 18 connected to a sample piece Q based on actual image data, it is possible to perform the template matching with high matching accuracy without depending on the shape of the needle 18 connected to the sample piece Q. Accordingly, the computer 22 can accurately locate the position of the needle 18 connected to the sample piece Q in a three-dimensional space and can appropriately drive the needle 18 and the sample piece Q in the three-dimensional space.

Since the computer 22 extracts the positions of plural pillar-shaped portions 34 constituting the sample mount 33 using the known template of the sample mount 33, it can be checked whether a sample mount 33 in an appropriate state is present before driving the needle 18.

The computer 22 can accurately locate indirectly that the needle 18 and the sample piece Q reach the vicinity of the movement target position based on the variation in the absorbed current before and after the needle 18 connected to the sample piece Q reaches the irradiation area. Accordingly, the computer 22 can stop the needle 18 and the sample piece Q without coming in contact with another member such as the sample mount 33 which is present at the movement target position and thus can prevent occurrence of a problem such as damage due to the contact.

The computer 22 detects the electrical connection between the sample mount 33 and the needle 18 when the sample piece Q and the sample mount 33 are connected with a deposition layer. Accordingly, it is possible to accurately check whether the connection between the sample piece Q and the sample mount 33 is actually completed.

The computer 22 can cut the connection between the sample piece Q and the needle 18 after the electrical connection between the sample mount 33 and the needle 18 is detected and it is confirmed that the connection between the sample mount 33 and the sample piece Q is actually completed.

By matching the actual shape of the needle 18 with an ideal reference shape, the computer 22 can easily recognize the needle 18 by the pattern matching in driving the needle 18 in a three-dimensional space or the like and can accurately detect the position of the needle 18 in the three-dimensional space.

A first modification example of the above-mentioned embodiment will be described below.

In the above-mentioned embodiment, since the needle 18 is not reduced nor deformed without being irradiated with a focused ion beam, the shaping of the needle tip or the replacement of the needle 18 is not carried out. However, the computer 22 may perform a process of removing the carbon-deposition layer at the needle tip (referred to as cleaning of the needle 18 in this specification) at an appropriate timing, for example, every predetermined number of times of repeated performance, when the automatic sampling operation is repeatedly performed. For example, one cleaning process is performed every ten times of automatic sampling. A determination method for performing cleaning the needle 18 will be described below.

In a first method, first, a secondary electron image of the needle tip is acquired at a position at which no complicated structure is present in the background immediately before performing the automatic sampling or periodically. A carbon-deposition layer attached to the needle tip can be clearly observed in the secondary electron image. The secondary electron image is stored in the computer 22.

Then, an absorbed current image of the needle 18 is acquired in the same viewing field and at the same observation magnification without moving the needle 18. A carbon-deposition layer may not be observed in the absorbed current image and only the shape of the needle 18 can be recognized therefrom. The absorbed current image is also stored in the computer 22.

By subtracting the absorbed current image from the secondary electron image, the needle 18 is erased and the shape of the carbon-deposition layer protruding from the needle tip is actualized. When the area of the actualized carbon-deposition layer is greater than a predetermined area, the carbon-deposition layer is cleaned by irradiation with a focused ion beam so as not to cut the needle 18. At this time, the carbon-deposition layer may remain when the area of the carbon-deposition layer is equal to or less than the predetermined area.

In a second method, when the length of the carbon-deposition layer in the axial direction (length direction) of the needle 18 instead of the area of the actualized carbon-deposition layer is greater than a predetermined length, it may be determined that the cleaning timing of the needle 18 comes in.

In a third method, the coordinate of the tip of the carbon-deposition layer in the secondary electron image stored in the computer 22 is stored. In addition, the coordinate of the tip of the carbon-deposition layer in the absorbed current image stored in the computer 22 is stored. Here, the length of the carbon-deposition layer can be calculated from the tip coordinate of the carbon-deposition layer and the tip coordinate of the needle 18. When this length is greater than a predetermined value, it may be determined that the cleaning timing of the needle 18 comes in.

In a fourth method, a template of the needle tip shape, which is considered to be optimal, including the carbon-deposition layer may be prepared in advance, the template may be superimposed on the secondary electron image of the needle tip after the sampling are repeatedly performed, and a protruding part in the template may be cut off using a focused ion beam.

In a fifth method, when the thickness of the carbon-deposition layer of the tip of the needle 18 instead of the area of the actualized carbon-deposition layer is greater than a predetermined thickness, it may be determined that the cleaning timing of the needle 18 comes in.

These cleaning methods can be performed, for example, immediately after step S280 in FIG. 20.

The cleaning is performed using the above-mentioned methods or the like, but the needle 18 may be replaced when a predetermined shape is not acquired even by the cleaning, when the cleaning is not performed within a predetermined time, or every predetermined period. After the needle 18 is replaced, the above-mentioned process flow is not changed and the step of conserving the needle tip shape and the like are performed in the same way as described above.

A second modification example of the above-mentioned embodiment will be described below.

In the above-mentioned embodiment, the needle actuating mechanism 19 is integrally formed with the stage 12, but the present invention is not limited to this configuration. The needle actuating mechanism 19 may be formed independently of the stage 12. The needle actuating mechanism 19 may be fixed to, for example, the sample chamber 11 so as to be independent in tilting of the stage 12.

A third modification example of the above-mentioned embodiment will be described below.

In the above-mentioned embodiment, the optical axis of the focused ion beam irradiation optical system 14 is set to the vertical direction and the optical axis of the electron beam irradiation optical system 15 is set to a direction tilted with respect to the vertical direction, but the present invention is not limited to this configuration. For example, the optical axis of the focused ion beam irradiation optical system 14 may be set to a direction tilted with respect to the vertical direction and the optical axis of the electron beam irradiation optical system 15 may be set to the vertical direction.

A fourth modification example of the above-mentioned embodiment will be described below.

In the above-mentioned embodiment, the focused ion beam irradiation optical system 14 and the electron beam irradiation optical system 15 capable of two types of beams constitute the charged particle beam irradiation optical system, but the present invention is not limited to this configuration. For example, the charged particle beam irradiation optical system may be constituted by only the focused ion beam irradiation optical system 14 without using the electron beam irradiation optical system 15. Ions used in this case are negative ions.

In the above-mentioned embodiment, in the above-mentioned several steps, the sample piece holder P, the needle 18, the sample piece Q, and the like are irradiated with an electron beam and a focused ion beam from different directions, an image based on the electron beam and an image based on the focused ion beam are acquired, and the positions of the positional relationship among the sample piece holder P, the needle 18, the sample piece Q, and the like are located. However, only the focused ion beam irradiation optical system 14 may be provided and an image based on only the focused ion beam may be acquired.

For example, when the positional relationship between the sample piece holder P and the sample piece Q is located in step S220, images based on a focused ion beam can be acquired such that both the sample piece holder P and the sample piece Q enter the same viewing field in a state in which the stage 12 is horizontal and a state in which the stage 12 is tilted with respect to the horizontal direction at a specific tilt angle, and the three-dimensional positional relationship between the sample piece holder P and the sample piece Q can be located. As described above, since the needle actuating mechanism 19 can be moved horizontally and vertically and tilted along with the stage 12, the relative positional relationship between the sample piece holder P and the sample piece Q is maintained without depending on whether the stage 12 is horizontal or tilted. Accordingly, even when the charged particle beam irradiation optical system includes only the focused ion beam irradiation optical system 14, it is possible to observe and work the sample piece Q from two different directions.

Similarly, the registration of image data of the sample piece holder P in step S020, the recognition of the needle position in step S040, the acquisition of the template (reference image) of the needle in step S050, the acquisition of the reference image of the needle 18 connected to the sample piece Q in step S170, the recognition of the attachment position of the sample piece Q in step S210, and the stopping of the movement of the needle in step S250 can be carried out in the same way.

In the connection of the sample piece Q and the sample piece holder P in step S250, a deposition layer can be formed from the top end faces of the sample piece holder P and the sample piece Q to connect both in a state in which the stage 12 is horizontal, and the deposition layer can be formed from different directions in a state in which the stage 12 is tilted, thereby achieving satisfactory connection therebetween.

A fifth modification example of the above-mentioned embodiment will be described below.

In the above-mentioned embodiment, the computer 22 automatically performs a series of processes of steps S010 to S280 as the automatic sampling operation, but the present invention is not limited to this configuration. The computer 22 may switch any one process of steps S010 to S280 so as to be performed by an operator's manual operation.

When the automatic sampling operation of extracting plural sample pieces Q is performed, the computer 22 may perform the automatic sampling operation on one sample piece Q immediately before extracting the sample piece whenever one sample piece Q immediately before extracting plural sample pieces from the sample S is formed. The computer 22 may continuously perform the automatic sampling operation on the sample pieces Q immediately before extracting the sample pieces after all the sample pieces Q immediately before extracting plural sample pieces from the sample S are formed.

A sixth modification example of the above-mentioned embodiment will be described below.

In the above-mentioned embodiment, the computer 22 extracts the position of the pillar-shaped portion 34 using the known template of the pillar-shaped portion 34, but a reference pattern which is prepared from the actual image data of the pillar-shaped portion 34 in advance may be used as the template. The computer 22 may use a pattern which is prepared in performing automatic processing of forming the sample mount 33 as the template.

In the above-mentioned embodiment, the computer 22 may locate the relative positional relationship of the needle 18 to the position of the sample mount 33 using the reference mark Ref which is formed by irradiation with a charged particle beam in preparing the pillar-shaped portion 34. The computer 22 can appropriately (that is, without coming in contact with another member or device) drive the needle 18 in a three-dimensional space by sequentially detecting the relative position of the needle 18 to the position of the sample mount 33.

A seventh modification example of the above-mentioned embodiment will be described below.

In the above-mentioned embodiment, the processes of steps S220 to S250 of connecting the sample piece Q to the sample piece holder P may be performed as follows. That is, the positional relationship (distance therebetween) from the images of the pillar-shaped portion 34 of the sample piece holder P and the sample piece Q, and the needle actuating mechanism 19 is operated such that the distance therebetween reaches a target value.

Figure 27:
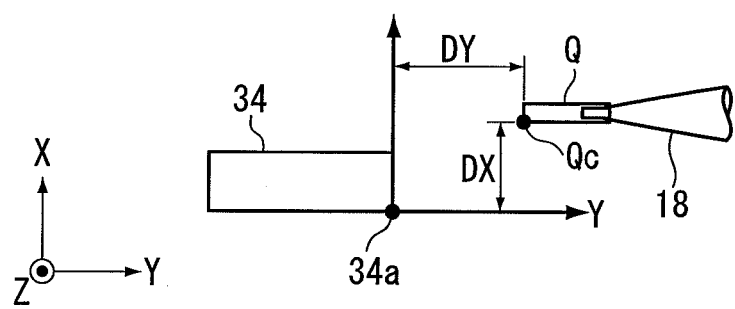
FIG. 27 is a diagram illustrating a positional relationship between a pillar-shaped portion and the sample piece based on an image which is acquired by irradiation with a focused ion beam in the charged particle beam apparatus according to the embodiment of the present invention.
Figure 28:
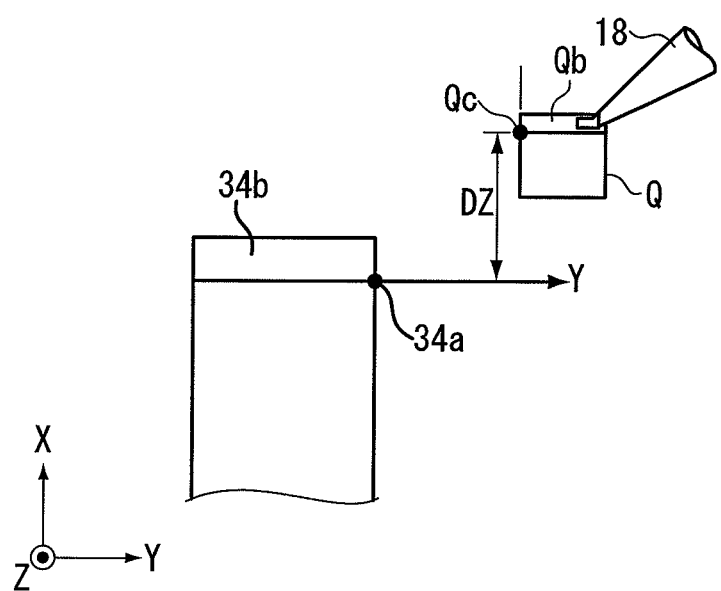
FIG. 28 is a diagram illustrating a positional relationship between a pillar-shaped portion and the sample piece based on an image which is acquired by irradiation with an electron beam in the charged particle beam apparatus according to the embodiment of the present invention.

In step S220, the computer 22 recognizes the relative relationship from secondary particle image data or absorbed current image data of the needle 18, the sample piece Q, and the pillar-shaped portion 34 based on an electron beam and a focused ion beam. FIGS. 27 and 28 are diagrams schematically illustrating the positional relationship between the pillar-shaped portion 34 and the sample piece Q. FIG. 27 is based on an image which is acquired by irradiation with a focused ion beam and FIG. 28 is based on an image which is acquired by irradiation with an electron beam. The relative positional relationship between the pillar-shaped portion 34 and the sample piece Q is measured from the drawings. An orthogonal three-axis coordinate system (a coordinate system different from the three-axis coordinate system of the stage 12) is determined with one corner of the pillar-shaped portion 34 as an origin 34a as illustrated in FIG. 27, and distances DX and DY are measured from FIG. 27 as distances between the original 34a of the pillar-shaped portion 34 and the reference point Qc of the sample piece Q.

On the other hand, a distance DZ is calculated from FIG. 28. When they are tilted by an angle θ (0°<θ≤90°) with respect to an electron beam optical axis and a focused ion beam optical axis (vertical), the actual distance in the Z axis direction between the pillar-shaped portion 34 and the sample piece Q would be: DZ/sin θ.

A movement stop positional relationship of the sample piece Q to the pillar-shaped portion 34 will be described below with reference to FIGS. 27 and 28.

In this positional relationship, the top end face 34b of the pillar-shaped portion 34 and the top end face Qb of the sample piece Q are flush with each other, the side surface of the pillar-shaped portion 34 and the end face of the sample piece Q are flush with each other, and a gap of about 0.5 μm is present between the pillar-shaped portion 34 and the sample piece Q. That is, by activating the needle actuating mechanism 19 so as to satisfy DX=0, DY=0.5 μm, and DZ=0, the sample piece Q can be made to reach a target stop position.

In a configuration in which the electron beam optical axis and the focused ion beam optical axis are perpendicular to each other (θ=90°), the value of the distance DZ between the pillar-shaped portion 34 and the sample piece Q which is measured by an electron beam is an actual distance therebetween.

An eighth modification example of the above-mentioned embodiment will be described below.

In the above-mentioned embodiment, in step S230, the needle actuating mechanism 19 is activated such that the gap between the pillar-shaped portion 34 and the sample piece Q which is measured from the image of the needle 18.

In the above-mentioned embodiment, the processes of steps S220 to S250 of connecting the sample piece Q to the sample piece holder P may be performed as follows. That is, an attachment position of the sample piece Q to the pillar-shaped portion 34 of the sample piece holder P is determined in advance as a template, the image of the sample piece Q is pattern-matched with the position, and the needle actuating mechanism 19 is activated.

The template indicating the movement stop positional relationship of the sample piece Q to the pillar-shaped portion 34 will be described. In this positional relationship, the top end face 34b of the pillar-shaped portion 34 and the top end face Qb of the sample piece Q are flush with each other, the side surface of the pillar-shaped portion 34 and the end face of the sample piece Q are flush with each other, and a gap of about 0.5 μm is present between the pillar-shaped portion 34 and the sample piece Q. This template may be prepared as a line drawing by extracting the profile (edge) from secondary particle image data or absorbed current image data of the actual sample piece holder P or the needle 18 connected to the sample piece Q, or may be prepared as a line drawing from a design drawing or a CAD drawing.

By superposing the pillar-shaped portion 34 in the prepared template on an image of the pillar-shaped portion 34 based on an electron beam and a focused ion beam in real time and instructing the needle actuating mechanism 19 to operate, the sample piece Q is moved to a stop position of the sample piece Q on the template (steps S230 and S240). It is confirmed that the image of the pillar-shaped portion 34 based on an electron beam and a focused ion beam in real time is superposed on the predetermined stop position of the sample piece Q on the template and the process of stopping the needle actuating mechanism 19 is performed (step S250). In this way, the sample piece Q can be accurately moved to satisfy the predetermined stop positional relationship to the pillar-shaped portion 34.

Figure 29:
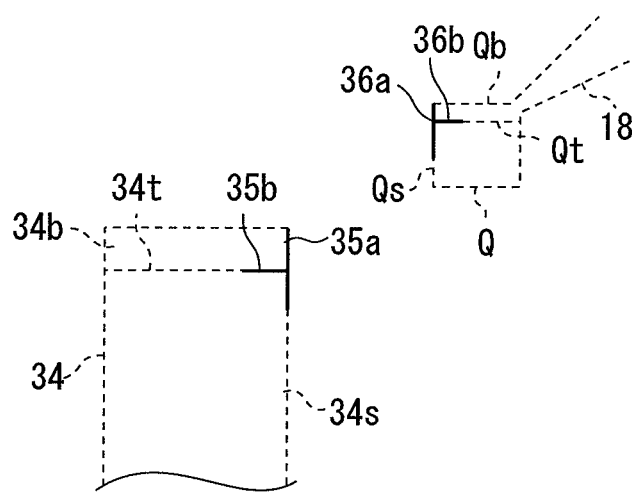
FIG. 29 is a diagram illustrating a template using edges of a pillar-shaped portion and the sample piece based on an image which is acquired by irradiation with an electron beam in the charged particle beam apparatus according to the embodiment of the present invention.
Figure 30:
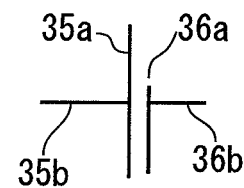
FIG. 30 is a diagram illustrating a template indicating a positional relationship when a pillar-shaped portion and the sample piece are connected in the charged particle beam apparatus according to the embodiment of the present invention.

Another example of the processes of steps S230 to S250 may be performed as follows. A line drawing of the edges extracted from the secondary particle image or the absorbed current image is limited to only a part which is least necessary for positioning both. FIG. 29 illustrates an example thereof, where profiles (indicated by dotted lines) of the pillar-shaped portion 34 and the sample piece Q and the extracted edges (indicated by thick solid lines) are illustrated. The edges of interest of the pillar-shaped portion 34 and the sample piece Q are parts of edges 34s and Qs facing each other and edges 34t and Qt of the top end faces 34b and Qb of the pillar-shaped portion 34 and the sample piece Q. Line segments 35a and 35b are sufficient for the pillar-shaped portion 34, line segments 36a and 36b are sufficient for the sample piece Q, and each line segment may be a part of each edge. For example, a template having a T shape is prepared from the line segments. The corresponding template is moved by activating the stage actuating mechanism 13 or the needle actuating mechanism 19. The gap, the parallelism, the heights of the pillar-shaped portion 34 and the sample piece Q can be located from the relative positional relationship in the templates 35a, 35b, 36a, and 36b, thereby easily positioning both. FIG. 30 is a diagram illustrating a positional relationship of the template corresponding to a predetermined positional relationship between the pillar-shaped portion 34 and the sample piece Q, where the line segments 35a and 36a are parallel to each other with a predetermined gap and the line segments 35b and 36b are located on the same line. At least one of the stage actuating mechanism 13 and the needle actuating mechanism 19 is activated and the activated driving mechanism is stopped when the template reaches the positional relationship illustrated in FIG. 30.

In this way, after it is confirmed that the sample piece Q approaches a predetermined pillar-shaped portion 34, the template can be used for accurate positioning.

Another example of the processes of steps S220 to S250 will be described below as a ninth modification example of the above-mentioned embodiment.

In step S230 of the above-mentioned embodiment, the needle 18 is moved. When the sample piece Q subjected to step S230 has a positional relationship greatly departing from a target position, the following operation may be performed.

In step S220, it is preferable that the position of the sample piece Q before movement be located in an area of Y>0 and Z>0 in an orthogonal three-axis coordinate system with an origin of each pillar-shaped portion 34. This is because there is a very small risk of collision of the sample piece Q with the pillar-shaped portion 34 while moving the needle 18. The X, Y, and Z driving units of the needle actuating mechanism 19 can be simultaneously activated to reach safely and rapidly reach a target position. On the other hand, when the position of the sample piece Q before movement is located in an area of Y<0 and the X, Y, and Z driving units of the needle actuating mechanism 19 are simultaneously activated to cause the sample piece Q to reach the stop position, there is a high risk of collision of the sample piece Q with the pillar-shaped portion 34. Accordingly, when the sample piece Q is located in an area of Y<0 in step S220, the needle 18 reaches the target position through a path avoiding the pillar-shaped portion 34. Specifically, first, only the Y driving unit of the needle actuating mechanism 19 is driven to move the sample piece Q to the area of Y>0 and to a predetermined position (position of two times, three times, five time, ten times, or the like the pillar-shaped portion 34 of interest), and then the sample piece Q is moved to the final stop position by the simultaneous activation of the X, Y, and Z driving unit. By this step, it is possible to safely and rapidly move the sample piece Q without colliding with the pillar-shaped portion 34. When it is confirmed from an electron beam image or/and a focused ion beam image that the X coordinates of the sample piece Q and the pillar-shaped portion 34 are equal to each other and the Z coordinate thereof is located lower than the top end of the pillar-shaped portion (Z<0), first, the sample piece Q is moved to an area of Z>0 (for example, a position of Z=2 μm, 3 μm, 5 μm, and 10 μm), then is moved to a predetermined position in the area of Y>0, and is moved to the final stop position by the simultaneous activation of the X, Y, and Z driving units. According to this movement, the sample piece Q can reach a target position without collision of the sample piece Q and the pillar-shaped portion 34.

A tenth modification example of the above-mentioned embodiment will be described below.

In the charged particle beam apparatus 10 according to the present invention, the needle 18 can be axially rotated by the needle actuating mechanism 19. In the above-mentioned embodiment, a basic sampling sequence in which the needle trimming is excluded and the axial rotation of the needle 18 is not used has been described, but an example using the axial rotation of the needle 18 will be described in the tenth modification example.

Since the computer 22 can activate the needle actuating mechanism 19 to axially rotate the needle 18, it is possible to perform posture control of the sample piece Q if necessary. The computer 22 rotates the sample piece Q extracted from the sample S and fixes the sample piece Q to the sample piece holder P in a state in which the sample piece Q is changed vertically or horizontally. The computer 22 fixes the sample piece Q such that the surface of the original sample S in the sample piece Q is perpendicular or parallel to the end face of the pillar-shaped portion 34. Accordingly, the computer 22 can secure, for example, the posture of the sample piece Q suitable for a finishing process to be performed later and can reduce an influence of a curtain effect (which is a worked striped pattern formed in the focused ion beam irradiation direction and causes erroneous analysis when the completed sample piece is observed with an electron microscope) occurring in thin-piece finishing of the sample piece Q or the like. The computer 22 corrects the rotation such that the sample piece Q departs from the actual viewing field by performing eccentricity correction in rotating the needle 18.

The computer 22 shapes the sample piece Q by irradiation with a focused ion beam if necessary. Particularly, it is preferable that the end face of the shaped sample piece Q coming in contact with the pillar-shaped portion 34 be almost parallel to the end face of the pillar-shaped portion 34. The computer 22 performs a shaping process such as cutting a part of the sample piece Q before template preparation to be described later. The computer 22 sets the processing position of the shaping process based on the distance from the needle 18. Accordingly, the computer 22 can easily extract the edges from a template to be described later and can secure the shape of the sample piece Q suitable for the finishing process which will be described later.

Subsequently to step S150, in the posture control, first, the computer 22 drives the needle 18 using the needle actuating mechanism 19 to rotate the needle 18 by an angle corresponding to the posture control mode such that the posture of the sample piece Q becomes a predetermined posture. Here, the posture control mode is a mode in which the sample piece Q is controlled to a predetermined posture and the posture of the sample piece Q is controlled by approaching the needle 18 to the sample piece Q at a predetermined angle and rotating the needle 18 connected to the sample piece Q at a predetermined angle. The computer 22 performs eccentricity correction in rotating the needle 18. FIGS. 31 to 36 illustrate this state and are diagrams illustrating states of the needle 18 connected to the sample piece Q in plural (for example, three) different approach modes.

Figure 31:
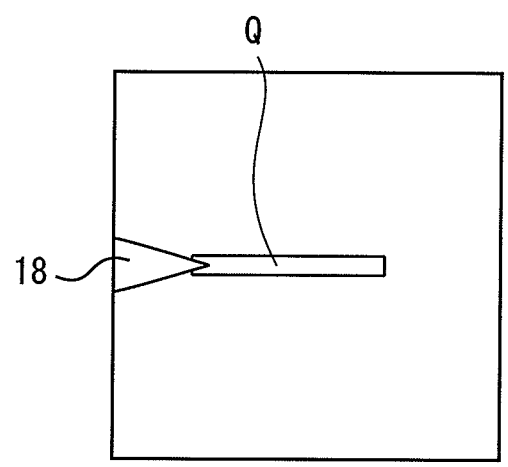
FIG. 31 is a diagram illustrating a state of an approach mode at a rotational angle of 0° of the needle connected to the sample piece in an image which is acquired using a focused ion beam in the charged particle beam apparatus according to the embodiment of the present invention.
Figure 32:
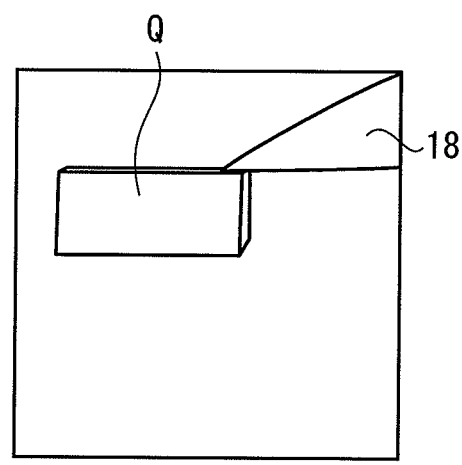
FIG. 32 is a diagram illustrating a state of the approach mode at a rotational angle of 0° of the needle connected to the sample piece in an image which is acquired using an electron beam in the charged particle beam apparatus according to the embodiment of the present invention.

FIGS. 31 and 32 are diagram illustrating a state (FIG. 31) of the needle 18 connected to the sample piece Q in image data which is acquired using a focused ion beam in the charged particle beam apparatus 10 according to the embodiment of the present invention in the approach mode in which the rotation angle of the needle 18 is 0° and a state (FIG. 32) of the needle 18 connected to the sample piece Q in image data which is acquired using an electron beam. The computer 22 sets a posture suitable for transferring the sample piece Q to the sample piece holder P without rotating the needle 18 in the approach mode in which the rotation angle of the needle 18 is 0°.

Figure 33:
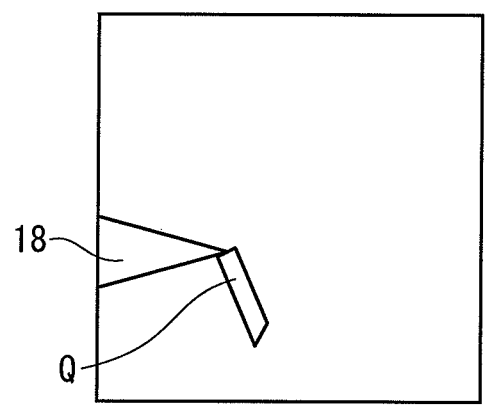
FIG. 33 is a diagram illustrating a state of the approach mode at a rotational angle of 90° of the needle connected to the sample piece in an image which is acquired using a focused ion beam in the charged particle beam apparatus according to the embodiment of the present invention.
Figure 34:
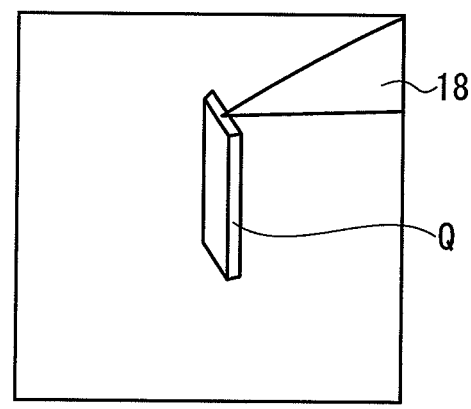
FIG. 34 is a diagram illustrating a state of the approach mode at a rotational angle of 90° of the needle connected to the sample piece in an image which is acquired using an electron beam in the charged particle beam apparatus according to the embodiment of the present invention.

FIGS. 33 and 34 are diagram illustrating a state (FIG. 33) in which the needle 18 connected to the sample piece Q is rotated by 90° in the image data which is acquired using a focused ion beam in the charged particle beam apparatus 10 according to the embodiment of the present invention in the approach mode in which the rotation angle of the needle 18 is 90° and a state (FIG. 34) in which the needle 18 connected to the sample piece Q is rotated by 90° in the image data which is acquired using an electron beam. The computer 22 sets a posture suitable for transferring the sample piece Q to the sample piece holder P in a state in which the needle 18 is rotated by 90° in the approach mode in which the rotation angle of the needle 18 is 90°.

Figure 35:
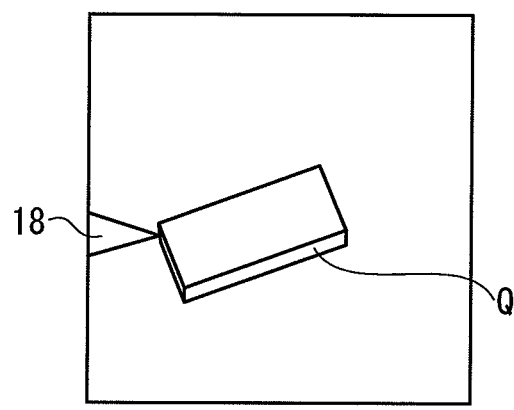
FIG. 35 is a diagram illustrating a state of the approach mode at a rotational angle of 180° of the needle connected to the sample piece in an image which is acquired using a focused ion beam in the charged particle beam apparatus according to the embodiment of the present invention.
Figure 36:
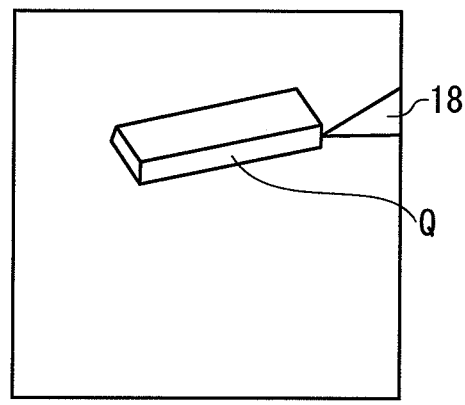
FIG. 36 is a diagram illustrating a state of the approach mode at a rotational angle of 180° of the needle connected to the sample piece in an image which is acquired using an electron beam in the charged particle beam apparatus according to the embodiment of the present invention.

FIGS. 35 and 36 are diagram illustrating a state (FIG. 35) in which the needle 18 connected to the sample piece Q is rotated by 180° in the image data which is acquired using a focused ion beam in the charged particle beam apparatus 10 according to the embodiment of the present invention in the approach mode in which the rotation angle of the needle 18 is 180° and a state (FIG. 36) in which the needle 18 connected to the sample piece Q is rotated by 180° in the image data which is acquired using an electron beam. The computer 22 sets a posture suitable for transferring the sample piece Q to the sample piece holder P in a state in which the needle 18 is rotated by 180° in the approach mode in which the rotation angle of the needle 18 is 180°.

The relative connecting posture of the needle 18 and the sample piece Q is set to a connecting posture suitable for each approach mode in connecting the needle 18 to the sample piece Q in the above-mentioned sample piece pickup step.

Other embodiments will be described below.

(a1) A charged particle beam apparatus automatically prepares a sample piece from a sample. The charged particle beam apparatus includes, at least:

a plurality of charged particle beam irradiation optical systems (beam irradiation optical systems) each irradiates a charged particle beam;

a sample stage that moves with the sample placed thereon;

a sample piece transferring unit that includes a needle that is connectable to the sample piece that is separated and extracted from the sample and transfers the sample piece;

a holder support that holds a sample piece holder having a pillar-shaped portion to which the sample piece is transferred;

a gas supply unit that supplies gas for forming a deposition layer by irradiation with the charged particle beam; and a computer that controls at least the charged particle beam irradiation optical systems, the sample piece transferring unit, and the gas supply unit so as to measure electrical characteristics between the sample piece and the pillar-shaped portion and to form the deposition layer over a gap between the pillar-shaped portion and the sample piece that is positioned to have the gap with the pillar-shaped portion until a predetermined electrical characteristic value is achieved.

(a2) A charged particle beam apparatus automatically prepares a sample piece from a sample. The charged particle beam apparatus includes, at least:

a plurality of charged particle beam irradiation optical systems (beam irradiation optical systems) each applies a charged particle beam;

a sample stage that moves with the sample placed thereon;

a sample piece transferring unit that includes a needle that is connectable with the sample piece that is separated and extracted from the sample and transfers the sample piece;

a holder support that holds a sample piece holder having a pillar-shaped portion to which the sample piece is transferred;

a gas supply unit that supplies gas for forming a deposition layer by irradiation with the charged particle beam; and a computer that controls at least the charged particle beam irradiation optical systems, the sample piece transferring unit, and the gas supply unit so as to measure electrical characteristics between the sample piece and the pillar-shaped portion and to form the deposition layer over a gap between the pillar-shaped portion and the sample piece that is positioned to have the gap with the pillar-shaped portion for a predetermined time period.

(a3) A charged particle beam apparatus automatically prepares a sample piece from a sample. The charged particle beam apparatus includes, at least:

a focused ion beam irradiation optical system (beam irradiation optical system) that applies a focused ion beam;

a sample stage that moves with the sample placed thereon;

a sample piece transferring unit that includes a needle that is connectable with the sample piece that is separated and extracted from the sample and transfers the sample piece;

a holder support that holds a sample piece holder having a pillar-shaped portion to which the sample piece is transferred;

a gas supply unit that supplies gas for forming a deposition layer by irradiation with the focused ion beam; and a computer that controls at least the focused ion beam irradiation optical system, the sample piece transferring unit, and the gas supply unit so as to measure electrical characteristics between the sample piece and the pillar-shaped portion and to form the deposition layer over a gap between the pillar-shaped portion and the sample piece that is positioned to have a gap with the pillar-shaped portion until a predetermined electrical characteristic value is achieved.

(a4) A charged particle beam apparatus automatically prepares a sample piece from a sample. The charged particle beam apparatus includes, at least:

a focused ion beam irradiation optical system (beam irradiation optical system) that applies a focused ion beam;

a sample stage that moves with the sample placed thereon;

a sample piece transferring unit that includes a needle that is connectable with the sample piece that is separated and extracted from the sample and transfers the sample piece;

a holder support that holds a sample piece holder having a pillar-shaped portion to which the sample piece is transferred;

a gas supply unit that supplies gas for forming a deposition layer by irradiation with the focused ion beam; and a computer that controls at least the focused ion beam irradiation optical system, the sample piece transferring unit, and the gas supply unit so as to measure electrical characteristics between the sample piece and the pillar-shaped portion and to form the deposition layer over a gap between the pillar-shaped portion and the sample piece that is positioned to have the gap with the pillar-shaped portion for a predetermined time period.

(a5) In the charged particle beam apparatus according to (a1) or (a2), the charged particle beam may include at least a focused ion beam and an electron beam.

(a6) In the charged particle beam apparatus according to any one of (a1) to (a4), the electrical characteristic may be any one of an electrical resistance, a current, and a potential (a7) In the charged particle beam apparatus according to any one of (a1) to (a6), the computer may control at least the beam irradiation optical system, the sample piece transferring unit, and the gas supply unit so as to move the sample piece to further narrow the gap between the pillar-shaped portion and the sample piece and to form the deposition layer over the gap between the pillar-shaped portion and the sample piece that is positioned still when the electrical characteristics between the sample piece and the pillar-shaped portion does not satisfy a predetermined electrical characteristic value within a predetermined formation time of the deposition layer.

(a8) In the charged particle beam apparatus according to any one of (a1) to (a6), the computer may control at least the beam irradiation optical system and the gas supply unit so as to stop formation of the deposition layer when the electrical characteristic between the sample piece and the pillar-shaped portion satisfies a predetermined electrical characteristic value within a predetermined formation time of the deposition layer.

(a9) In the charged particle beam apparatus according to (a1) or (a3), the gap may be equal to or less than 1 μm.

(a10) In the charged particle beam apparatus according to (a9), the gap may be equal to or greater than 100 nm and equal to or less than 200 nm.

(b1) A charged particle beam apparatus automatically prepares a sample piece from a sample. The charged particle beam apparatus includes:
a charged particle beam irradiation optical system that irradiates a charged particle beam;
a sample stage that moves with the sample placed thereon;
a sample piece transferring unit that holds and transfers the sample piece that is separated and extracted from the sample;
a holder support that holds a sample piece holder having a pillar-shaped portion to which the sample piece is transferred; and
a computer that controls the charged particle beam irradiation optical system and the sample piece transferring unit so as to prepare a template of the pillar-shaped portion based on an image of the pillar shaped portion which is acquired by irradiation with the charged particle beam and transfer the sample piece to the pillar-shaped portion based on position information which is acquired by template matching using the template.

(b2) In the charged particle beam apparatus according to (b1), the sample piece holder may include a plurality of pillar-shaped portions which are arranged to be separated from each other, and the computer may prepare templates of the plural pillar-shaped portions based on images of the plural pillar-shaped portions.

(b3) In the charged particle beam apparatus according to (b2), the computer may perform a determination process of determining whether the shape of the target pillar-shaped portion among the plural pillar-shaped portions matches a pre-registered predetermined shape by the template matching using the templates of the plurality of pillar-shaped portions, and may control the charged particle beam irradiation optical system and the sample piece transferring unit or movement of the sample stage so as to switch a target pillar-shaped portion to a newly selected pillar-shaped portion and to perform the determination process when the shape of the target pillar-shaped portion does not match the predetermined shape and to transfer the sample piece to the newly selected pillar-shaped portion when the shape of the newly selected target pillar-shaped portion matches the predetermined shape.

(b4) In the charged particle beam apparatus according to (b2) or (b3), the computer may control the sample stage to move to a default position when the target pillar-shaped portion is not located at a predetermined position in controlling the movement of the sample stage so as to locate the target pillar-shaped portion among the plurality of pillar-shaped portions at the predetermined position.

(b5) In the charged particle beam apparatus according to (b4), the computer may perform a shape determining process of determining whether the shape of the target pillar-shaped portion has any problem after the sample stage is moved in controlling the movement of the sample stage so as to locate the target pillar-shaped portion among the plurality of pillar-shaped portions at the predetermined position, and control the movement of the sample stage so as to switch the target pillar-shaped portion to the newly selected pillar-shaped portion and to locate the newly selected pillar-shaped portion at the predetermined position and performs the shape determining process when the shape of the target pillar-shaped portion has any problem.

(b6) In the charged particle beam apparatus according to any one of (b1) to (b5), the computer may prepare a template of the pillar-shaped portion before separating and extracting the sample piece from the sample.

(b7) In the charged particle beam apparatus according to (b3), the computer may store images of the plural pillar-shaped portions, edge information extracted from the images, or design information of the plurality of pillar-shaped portions as the templates and determine whether the shape of the target pillar-shaped portion matches the predetermined shape based on a score of the template matching using the templates.

(b8) In the charged particle beam apparatus according to any one of (b1) to (b7), the computer may store an image acquired by irradiation of the pillar-shaped portion to which the sample piece is transferred with the charged particle beam and position information of the pillar-shaped portion to which the sample piece is transferred.

(c1) A charged particle beam apparatus automatically prepares a sample piece from a sample. The charged particle beam apparatus includes:
a charged particle beam irradiation optical systems that irradiates a charged particle beam;
a sample stage that moves with the sample placed thereon;
a sample piece transferring unit that holds and transfers the sample piece that is separated and extracted from the sample;
a holder support that holds a sample piece holder having a pillar-shaped portion to which the sample piece is transferred;
a gas supply unit that supplies gas for forming a deposition layer by irradiation with the charged particle beam; and
a computer that controls the charged particle beam irradiation optical systems and the sample piece transferring unit so as to irradiate the deposition layer attached to the sample piece transferring unit with the charged particle beam after the sample piece transferring unit is separated from the sample piece.

(c2) In the charged particle beam apparatus according to (c1), the sample piece transferring unit may hold and transfer each of a plurality of the sample pieces repeatedly, each of which being separated and extracted from the sample.

(c3) In the charged particle beam apparatus according to (c1) or (c3), the computer may control the charged particle beam irradiation optical system and the sample piece transferring unit so as to repeatedly irradiate the deposition layer attached to the sample piece transferring unit with the charged particle beam at predetermined timings including at least a timing at which the sample piece transferring unit is separated from the sample piece.

(c4) In the charged particle beam apparatus according to any one of (c1) to (c3), the computer may control the sample piece transferring unit to move to a default position when the sample piece transferring unit is not located at a predetermined position in controlling the movement of the sample piece transferring unit so as to locate the sample piece separated from the sample piece transferring unit to the predetermined position.

(c5) In the charged particle beam apparatus according to (c4), the computer may control the sample piece transferring unit to stop when the sample piece transferring unit is not located at the predetermined position after controlling the sample piece transferring unit to move to the predetermined position after controlling the sample piece transferring unit to move to the default position.

(c6) In the charged particle beam apparatus according to any one of (c1) to (c5), the computer may control the charged particle beam irradiation optical system and the sample piece transferring unit so as to prepare a template of the sample piece transferring unit based on an image which is acquired by irradiation of the sample piece transferring unit with the charged particle beam before connecting the sample piece transferring unit with the sample piece and to irradiate the deposition layer attached to the sample piece transferring unit with the charged particle beam based on profile information which is acquired by template matching the template.

(c7) The charged particle beam apparatus according to (c6) may further include: a display device that displays the profile information.

(c8) In the charged particle beam apparatus according to any one of (c1) to (c7), the computer may perform eccentricity correction in rotating the sample piece transferring unit around a central axis such that the sample piece transferring unit have a predetermined posture.

(c9) In the charged particle beam apparatus according to any one of (c1) to (c8), the sample piece transferring unit may include a needle or a pair of tweezers that is connectable with the sample piece.

In the above-mentioned embodiment, the computer 22 may include software functional units or hardware functional units such as an LSI.

In the above-mentioned embodiment, a sharpened needle-like member is described as an example of the needle 18, but the tip thereof may have a flat chisel shape.

The present invention can also be applied to a case in which at least a sample piece Q to be extracted is formed of carbon. In the present invention, it is possible to move the needle to a desired position using the template and the tip position coordinate. That is, in transferring an extracted sample piece Q to the sample piece holder P in a state in which the sample piece Q is fixed to the tip of the needle 18, the sample piece Q can be controlled to approach the sample piece holder P with a predetermined gap therebetween and to be stopped based on the true tip coordinate (the tip coordinate of the sample piece) acquired from the secondary electron image by irradiating the needle 18 having the sample piece Q attached thereto with a charged particle beam and the template of the needle 18 formed from the absorbed current image of the needle 18 having the sample piece Q attached thereto.

The present invention can also be applied to another device. For example, in a charged particle beam apparatus that measures electrical characteristics of a minute portion by bringing a probe into contact with the minute portion, particularly, in a charged particle beam apparatus that measures electrical characteristics of a minute portion using a probe having a carbon nanotube at a tip of a tungsten probe to come in contact with a conductive portion of a minute area with equipment having a metal probe in a sample chamber of a scanning electron microscope with irradiation with an electron beam as a charged particle beam, the tip of the tungsten probe may not be recognized because of a background such as a wiring pattern in a normal secondary electron image. Therefore, the tungsten probe can be easily recognized using an absorbed current image, but the tip of the carbon nanotube may not be recognized therein and thus the carbon nanotube may not be brought into contact with an important measurement point. Accordingly, in the present invention, by using the method of specifying the true tip coordinate of the needle 18 using the secondary electron image and preparing a template using the absorbed current image, it is possible to move and bring the probe having the carbon nanotube attached thereto into contact with a specific measurement position.

A sample piece Q prepared by the charged particle beam apparatus 10 according to the present invention may be introduced into another focused ion beam device and may be carefully worked by a device operator up to a thickness suitable for transmission electron microscope analysis. By using the focused ion beam device in cooperation with the charged particle beam apparatus 10 according to the present invention in this way, plural sample pieces Q can be fixed to the sample piece holder P in the nighttime in an unmanned manner and the device operator can carefully complete very thin samples for a transmission electron microscope in the daytime. Accordingly, in comparison with a case in which a series of operations from the sample extraction to the thin piece processing depend on the operation of the device operator using a single device, it is possible to greatly reduce a mental and physical burden on the device operator and thus to improve work efficiency.

The above-mentioned embodiment is merely an example and does not intend to limit the scope of the present invention. These embodiments can be modified in various forms and can be subjected to various omissions, substitutions, and alterations without departing from the gist of the present invention. The embodiments or modifications thereof are included in the scope or the gist of the present invention and are included in the scope equivalent to the invention described in the appended claims.

For example, in the charged particle beam apparatus 10 according to the present invention, the needle 18 has been described as a unit for extracting a sample piece Q, but the present invention is not limited to the needle and tweezers capable of finely operating may be used. By using the tweezers, a sample piece can be picked up without performing deposition and there is no possibility of damage and abrasion of the tip. Even when the needle 18 is used, the connection to the sample piece Q is not limited to the deposition, and the needle 18 may be brought into contact with the sample piece Q with an electrostatic force applied to the needle and the sample piece Q and the needle 18 may be connected by electrostatic suctioning.

REFERENCE SIGNS LIST

10: charged particle beam apparatus
11: sample chamber

12: stage (sample stage)
13: stage actuating mechanism
14: focused ion beam irradiation optical system (charged particle beam irradiation optical system)
15: electron beam irradiation optical system (charged particle beam irradiation optical system)
16: detector
17: gas supply unit
18: needle
19: needle actuating mechanism
20: absorbed current detector
21: display device
22: computer
23: input device
33: sample mount
34: pillar-shaped portion
P: sample piece holder
Q: sample piece
R: secondary charged particle
S: sample

What is claimed is:

1. A charged particle beam apparatus that automatically prepares a sample piece from a sample, the charged particle beam apparatus comprising:
a charged particle beam irradiation optical system that irradiates a charged particle beam;
a movable sample stage on which a sample is placed and moved;
a sample piece transferring unit that holds and transfers a sample piece that is separated and extracted from the sample;
a holder support that holds a sample piece holder to which the sample piece is transferred; and
a computer configured to control a position of an object based on a template prepared from an image of the object acquired by irradiation with the charged particle beam and position information acquired from the image of the object,
wherein the sample piece transferring unit includes a needle that transfers the sample piece that is separated and extracted from the sample, and a needle actuating mechanism that actuates the needle, and
wherein the computer controls the needle actuating mechanism so as to approach the needle to the sample piece using the template formed from an absorbed current image acquired by irradiating the needle with the charged particle beam.

2. The charged particle beam apparatus according to claim 1,
wherein the computer controls the needle actuating mechanism so as to control a position of the needle as the object relative to the sample piece.

3. The charged particle beam apparatus according to claim 2 further comprising:
a gas supply unit that supplies gas for forming a deposition layer by irradiation with the charged particle beam,
wherein the computer controls the charged particle beam irradiation optical system, the needle actuating mechanism, and the gas supply unit so as to approach the needle to the sample piece with a gap formed therebetween and then to connect the needle to the sample piece with the deposition layer.

4. The charged particle beam apparatus according to claim 2,
wherein the computer controls the needle actuating mechanism so as to approach the needle to the sample piece using a tip coordinate of the needle acquired from a secondary electron image obtained by irradiating the needle with the charged particle beam.

5. The charged particle beam apparatus according to claim 3,
wherein the gap between the needle and the sample piece in which the deposition layer is formed is equal to or less than 1 μm.

6. The charged particle beam apparatus according to claim 5,
wherein the gap between the needle and the sample piece in which the deposition layer is formed is equal to or more than 100 nm and equal to or less than 400 nm.

7. The charged particle beam apparatus according to claim 1,
wherein the sample piece holder includes a pillar-shaped portion to which the sample piece is transferred, and
wherein the computer controls the needle actuating mechanism so as to control the position of the sample piece relative to the pillar-shaped portion as the object.

* * * * *